United States Patent
Cha et al.

(10) Patent No.: US 12,457,828 B2
(45) Date of Patent: Oct. 28, 2025

(54) LIGHT-EMITTING ELEMENT AND DISPLAY DEVICE INCLUDING THE SAME

(71) Applicant: Samsung Display Co., LTD., Yongin-si (KR)

(72) Inventors: Hyung Rae Cha, Seoul (KR); Dae Hyun Kim, Hwaseong-si (KR); Dong Uk Kim, Hwaseong-si (KR); Dong Kyun Seo, Asan-si (KR); Young Chul Sim, Pyeongtaek-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 566 days.

(21) Appl. No.: 17/882,971

(22) Filed: Aug. 8, 2022

(65) Prior Publication Data

US 2023/0215986 A1    Jul. 6, 2023

(30) Foreign Application Priority Data

Jan. 4, 2022   (KR) .................. 10-2022-0000700

(51) Int. Cl.
*H10H 20/84*     (2025.01)
*H01L 25/16*     (2023.01)
(Continued)

(52) U.S. Cl.
CPC .......... *H10H 20/84* (2025.01); *H01L 25/167* (2013.01); *H01L 24/24* (2013.01); *H01L 24/25* (2013.01);
(Continued)

(58) Field of Classification Search
CPC .... H10H 20/84; H10H 20/018; H10H 20/034; H01L 25/167; H01L 24/24; H01L 24/25;
(Continued)

(56) References Cited

U.S. PATENT DOCUMENTS

| 6,674,138 B1 * | 1/2004 | Halliyal | ................ H01L 29/513 257/314 |
| 2019/0305035 A1 * | 10/2019 | Cho | ..................... H10H 29/142 |

(Continued)

FOREIGN PATENT DOCUMENTS

| CN | 112382716 | 2/2021 |
| JP | 2013-207274 | 10/2013 |

(Continued)

*Primary Examiner* — Tu-Tu V Ho
(74) *Attorney, Agent, or Firm* — Womble Bond Dickinson (US) LLP

(57) ABSTRACT

A light-emitting element includes a core comprising a first semiconductor layer, a second semiconductor layer disposed on the first semiconductor layer, and an emissive layer disposed between the first semiconductor layer and the second semiconductor layer, an interlayer dielectric film surrounding a side surface of the core, a first element insulating film surrounding an outer surface of the interlayer dielectric film, and a second element insulating film surrounding an outer surface of the first element insulating film. The interlayer dielectric film includes an oxide insulating material having a dielectric constant of about 10 or more, and the interlayer dielectric film has a thickness of less than or equal to about 5 nm.

20 Claims, 20 Drawing Sheets

(51) Int. Cl.
*H01L 23/00* (2006.01)
*H10H 20/01* (2025.01)

(52) U.S. Cl.
CPC ............... *H01L 2224/24051* (2013.01); *H01L 2224/24146* (2013.01); *H01L 2224/245* (2013.01); *H01L 2224/25175* (2013.01); *H01L 2924/01013* (2013.01); *H01L 2924/0549* (2013.01); *H01L 2924/12041* (2013.01); *H10H 20/018* (2025.01); *H10H 20/034* (2025.01)

(58) Field of Classification Search
CPC . H01L 2224/24051; H01L 2224/24146; H01L 2224/245; H01L 2224/25175; H01L 2924/01013; H01L 2924/0549; H01L 2924/12041
USPC .......................................................... 257/91
See application file for complete search history.

(56) References Cited

U.S. PATENT DOCUMENTS

| | | | |
|---|---|---|---|
| 2020/0357972 A1* | 11/2020 | Lutgen | ............... H10D 30/0295 |
| 2023/0018385 A1 | 1/2023 | Cha et al. | |
| 2023/0187418 A1* | 6/2023 | Do | ....................... H10H 20/857 |
| | | | 257/79 |
| 2024/0128406 A1* | 4/2024 | Yoshida | ................. H01S 5/141 |

FOREIGN PATENT DOCUMENTS

| | | |
|---|---|---|
| JP | 5491679 | 5/2014 |
| KR | 10-0706951 | 4/2007 |
| KR | 10-2014-0133012 | 11/2014 |
| KR | 10-1436123 | 11/2014 |
| KR | 10-1490758 | 2/2015 |

* cited by examiner

FIG. 9
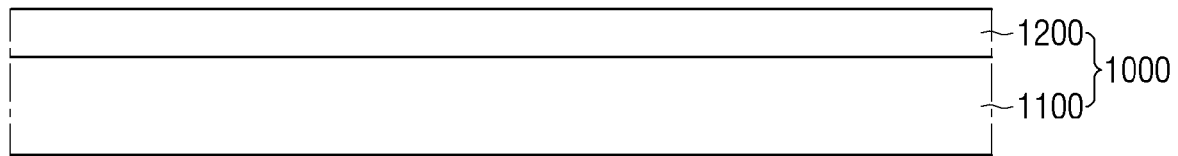
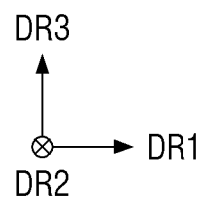

FIG. 10
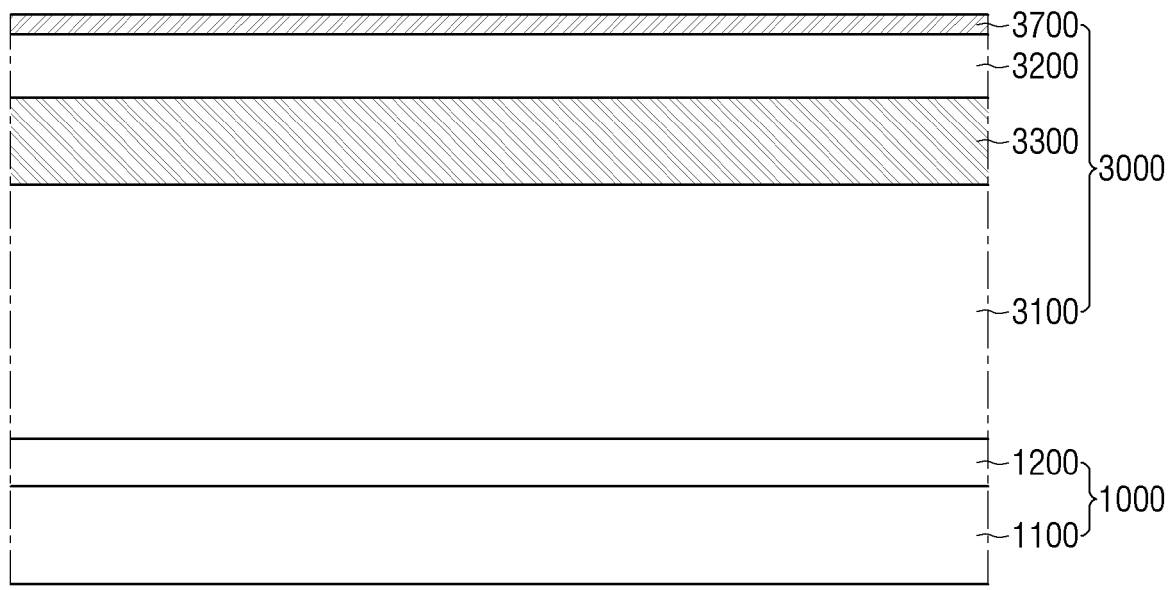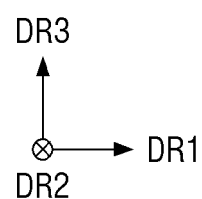

LIGHT-EMITTING ELEMENT AND DISPLAY DEVICE INCLUDING THE SAME

CROSS REFERENCE TO RELATED APPLICATION(S)

This application claims priority to and benefit of Korean Patent Application No. 10-2022-0000700 under 35 U.S.C. § 119, filed on Jan. 4, 2022, in the Korean Intellectual Property Office (KIPO), the disclosure of which is incorporated by reference herein in its entirety.

BACKGROUND

1. Technical Field

The disclosure relates to a light-emitting element and a display device including the same.

2. Description of the Related Art

Display devices become more and more important as multimedia technology evolves. Accordingly, a variety of types of display devices such as organic light-emitting display (OLED) devices and liquid-crystal display (LCD) devices are currently used.

Display devices include a display panel such as an organic light-emitting display panel and a liquid-crystal display panel for displaying images. A display panel may include light-emitting elements, which may be light-emitting diodes (LEDs). Examples of the light-emitting diodes may include an organic light-emitting diode using an organic material as a light-emitting material, an inorganic light-emitting diode using an inorganic material as a light-emitting material, etc.

SUMMARY

Aspects of the disclosure provide a light-emitting element with improved efficiency and reliability by virtue of multiple insulating films disposed directly on a side surface of a core including multiple semiconductor layers.

Aspects of the disclosure also provide a display device including a light-emitting element with improved efficiency and reliability by virtue of multiple insulating films disposed directly on a side surface of a core including a plurality of semiconductor layers.

It should be noted that objects of the disclosure are not limited to the above-mentioned object; and other objects of the disclosure will be apparent to those skilled in the art from the following descriptions.

According to the embodiments of the disclosure, a light-emitting element may include a core comprising a first semiconductor layer, a second semiconductor layer disposed on the first semiconductor layer, and an emissive layer disposed between the first semiconductor layer and the second semiconductor layer, an interlayer dielectric film surrounding a side surface of the core, a first element insulating film surrounding an outer surface of the interlayer dielectric film, and a second element insulating film surrounding an outer surface of the first element insulating film. The interlayer dielectric film may include an oxide insulating material having a dielectric constant of about 10 or more, and the interlayer dielectric film may have a thickness of less than or equal to about 5 nm.

The thickness of the interlayer dielectric film may be smaller than a thickness of the first element insulating film, and the thickness of the interlayer dielectric film may be smaller than a thickness of the second element insulating film.

The interlayer dielectric film may have a thickness of about 2 nm or less.

A thickness of the first element insulating film may be smaller than a thickness of the second element insulating film.

A ratio of the thickness of the first element insulating film to the thickness of the second element insulating film may be about 1:4.

The side surface of the core may include at least one of a side surface of the first semiconductor layer, a side surface of the second semiconductor layer, and a side surface of the emissive layer.

A dielectric constant of the interlayer dielectric film may be greater than a dielectric constant of the first element insulating film.

An etch rate of the first element insulating film with respect to an etchant may be lower than an etch rate of the second element insulating film.

The interlayer dielectric film may include at least one of hafnium silicon oxide ($HfSiO_x$), scandium oxide ($Se_xO_y$), hafnium oxide ($HfO_x$), zirconium oxide ($ZrO_x$), strontium oxide (SrO), yttrium oxide ($Y_xO_y$), tantalum oxide ($Ta_xO_y$), barium oxide (BaO), tungsten oxide ($WO_x$), titanium oxide ($TiO_x$), and lanthanum oxide ($La_xO_y$).

The first element insulating film may include silicon oxide ($SiO_x$).

The second element insulating film may include aluminum oxide ($Al_xO_y$).

The core, the interlayer dielectric film, the first element insulating film, and the second element insulating film may have a circular shape in a plan view.

A length of the core in a longitudinal direction may be greater than a length of the interlayer dielectric film in the longitudinal direction.

A thin-film density of the first element insulating film may be higher than a thin-film density of the second element insulating film.

According to the embodiments of the disclosure, a display device may include a first electrode and a second electrode disposed on a substrate and spaced apart from each other, a light-emitting element disposed between the first electrode and the second electrode, and an insulating layer disposed on the light-emitting element. The light-emitting elements may include: a core that may include a first semiconductor layer, a second semiconductor layer disposed on the first semiconductor layer, and an emissive layer disposed between the first semiconductor layer and the second semiconductor layer, an interlayer dielectric film surrounding a side surface of the core, a first element insulating film surrounding an outer surface of the interlayer dielectric film, and a second element insulating film surrounding an outer surface of the first element insulating film. The insulating layer may at least partially overlap the interlayer dielectric film, the first element insulating film, and the second element insulating film in a thickness direction of the substrate, and the first semiconductor layer, the emissive layer, and the second semiconductor layer may be sequentially arranged in a direction intersecting the thickness direction of the substrate.

A thickness of the interlayer dielectric film may be smaller than a thickness of the first insulating film, the thickness of the interlayer dielectric film may be smaller than a thickness of the second insulating film, and the thickness of the first element insulating film may be smaller than the thickness of the second element insulating film.

The interlayer dielectric film may include an oxide insulating material having a dielectric constant of about 10 or more.

The interlayer dielectric film may have a thickness of less than or equal to about 5 nm.

The first electrode and the second electrode may be spaced apart from each other in the direction intersecting the thickness direction of the substrate, and a length of the light-emitting element in the direction intersecting the thickness direction of the substrate may be greater than a shortest distance between the first electrode and the second electrode.

The second element insulating film may include a first portion overlapping the insulating layer in the thickness direction of the substrate and having a first thickness, and a second portion offset from the insulating layer in the thickness direction of the substrate and having a second thickness. The first thickness may be greater than the second thickness.

According to an embodiment of the disclosure, multiple insulating films are disposed directly on the side of the core including multiple semiconductor layers, so that it is possible to prevent surface defects of the core. As a result, the efficiency of the element can be improved, and oxygen diffusion can be prevented to improve the reliability of the element.

It should be noted that effects of the disclosure are not limited to those described above and other effects of the disclosure will be apparent to those skilled in the art from the following descriptions.

BRIEF DESCRIPTION OF THE DRAWINGS

The above and other aspects and features of the disclosure will become more apparent by describing in detail embodiments thereof with reference to the attached drawings, in which:

FIGS. 9 to 14 are schematic cross-sectional views showing processing steps of a method of fabricating a light-emitting diode according to an embodiment of the disclosure.

DETAILED DESCRIPTION OF THE EMBODIMENTS

Figure 1:
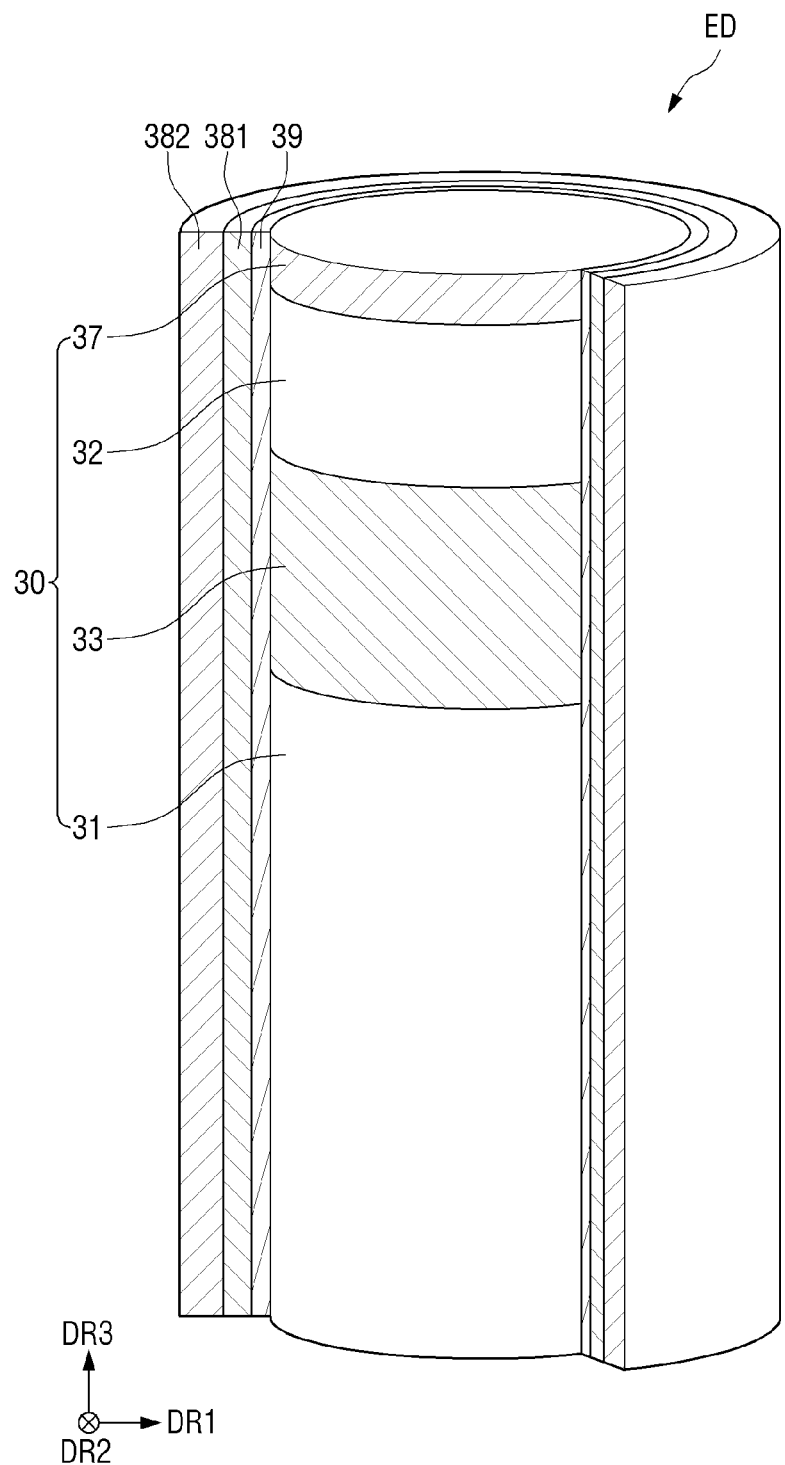
FIG. 1 is a schematic perspective view of a light-emitting element according to an embodiment of the disclosure.

The disclosure will be described with reference to perspective views, cross-sectional views, and/or plan views, in which embodiments of the disclosure are shown. Thus, the profile of a view may be modified according to manufacturing techniques and/or allowances. The embodiments of the disclosure are not intended to limit the scope of the disclosure but cover all changes and modifications that can be caused due to a change in manufacturing process. Thus, regions shown in the drawings are illustrated in schematic form and the shapes of the regions are presented simply by way of illustration and not as a limitation.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientations) and the spatially relative descriptors used herein interpreted accordingly.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Also, when an element is referred to as being "in contact" or "contacted" or the like to another element, the element may be in "electrical contact" or in "physical contact" with another element; or in "indirect contact" or in "direct contact" with another element.

Further, the X-axis, the Y-axis, and the Z-axis are not limited to three axes of a rectangular coordinate system, such as the x, y, and z axes, and may be interpreted in a broader sense. For example, the X-axis, the Y-axis, and the Z-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Unless otherwise defined or implied herein, all terms (including technical and scientific terms) used have the same meaning as commonly understood by those skilled in the art to which this disclosure pertains. It will be further understood that terms, such as those defined in commonly used dictionaries, should be interpreted as having a meaning that is consistent with their meaning in the context of the relevant art and should not be interpreted in an ideal or excessively formal sense unless clearly defined in the specification.

Hereinafter, embodiments of the disclosure will be described with reference to the accompanying drawings.

Figure 2:
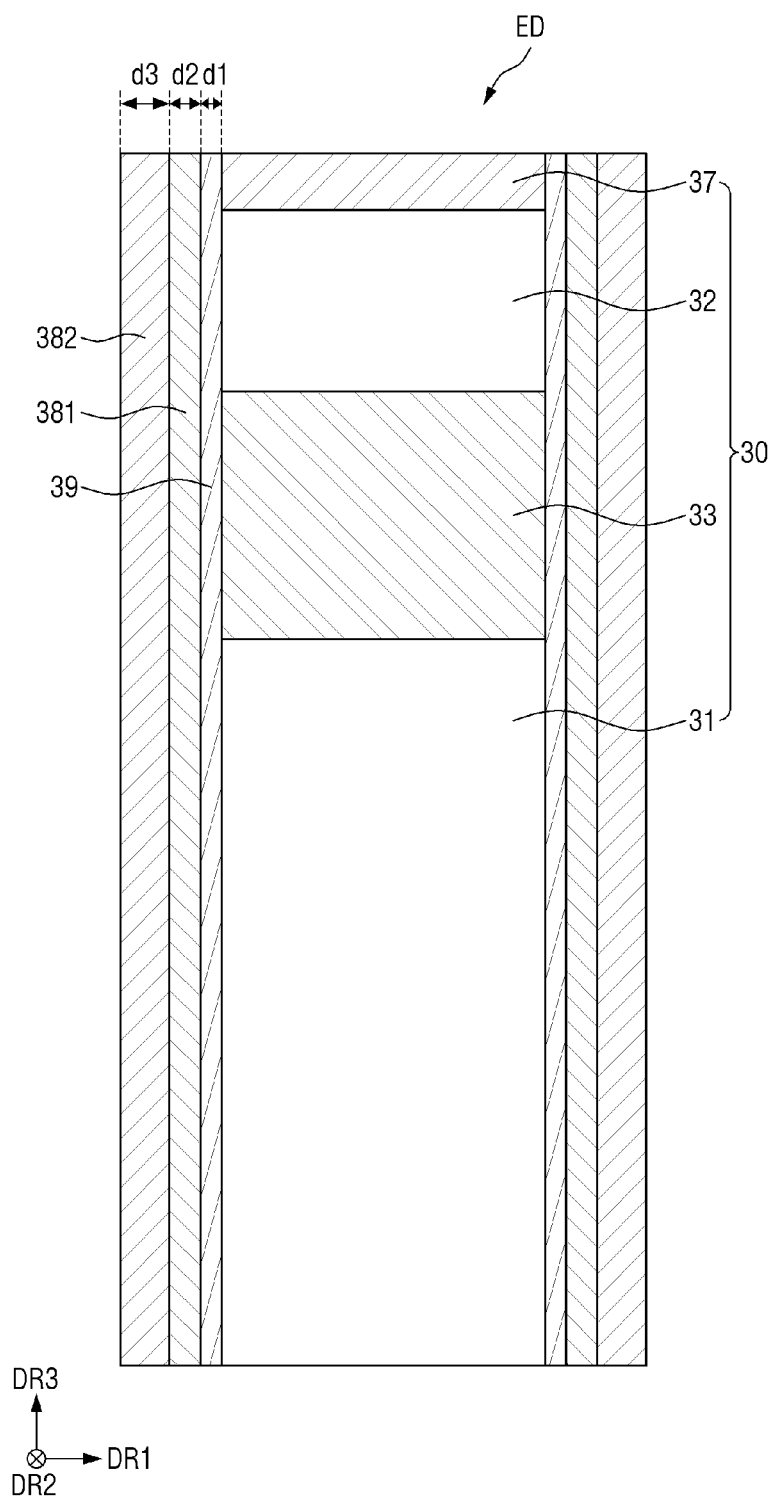
FIG. 2 is a schematic cross-sectional view showing the light-emitting element according to the embodiment of the disclosure.
Figure 3:
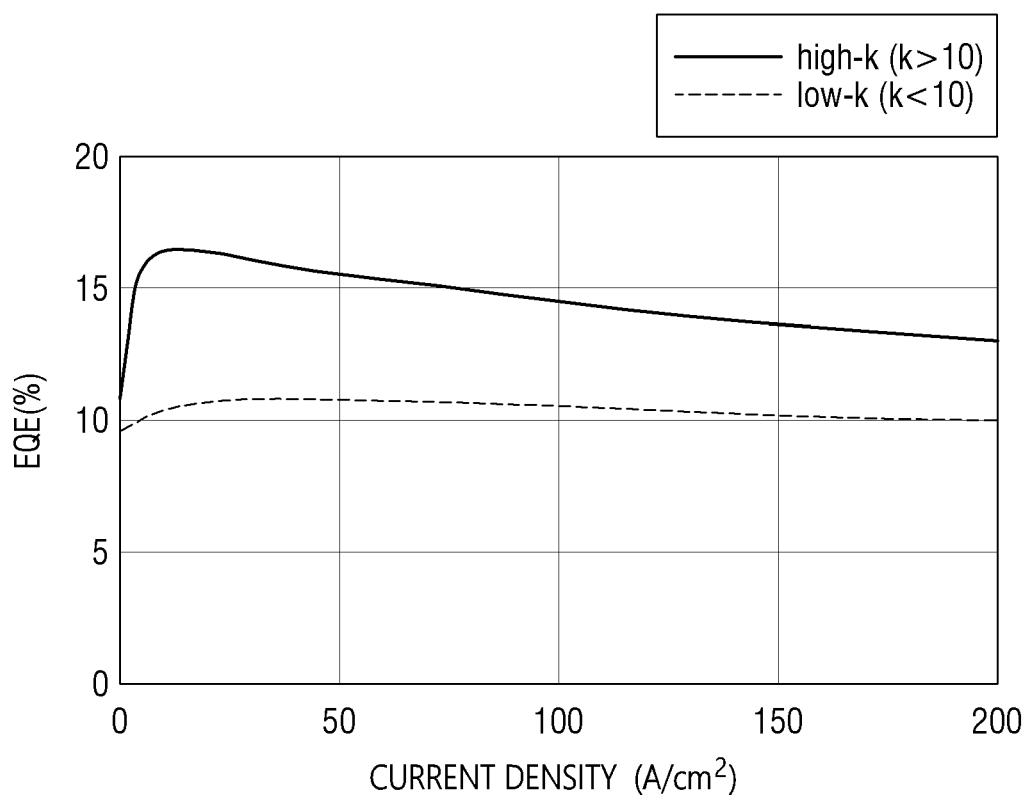
FIG. 3 is a graph showing current density-internal quantum efficiency versus dielectric constant of an interlayer dielectric film.
Figure 4:
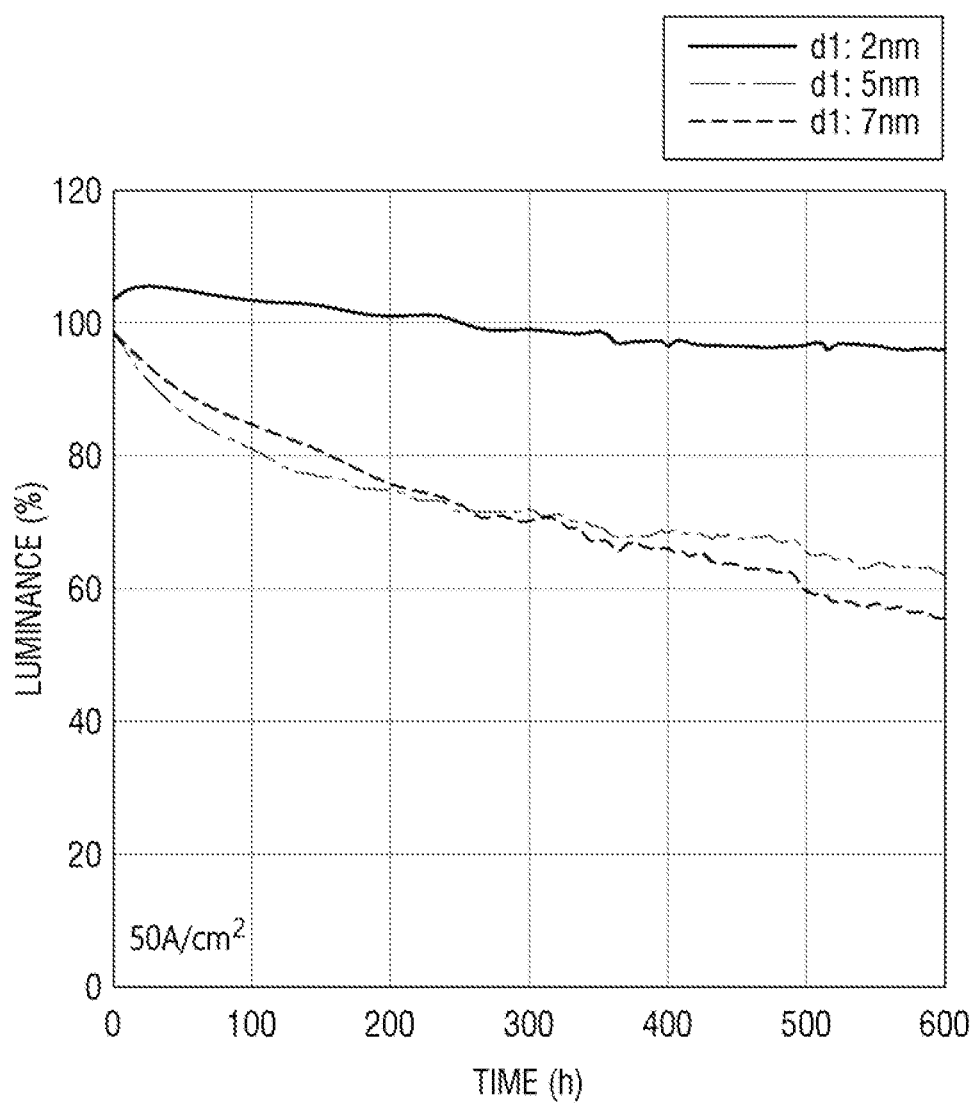
FIG. 4 is a graph showing luminance change over time for different thicknesses of an insulating film.
Figure 5:
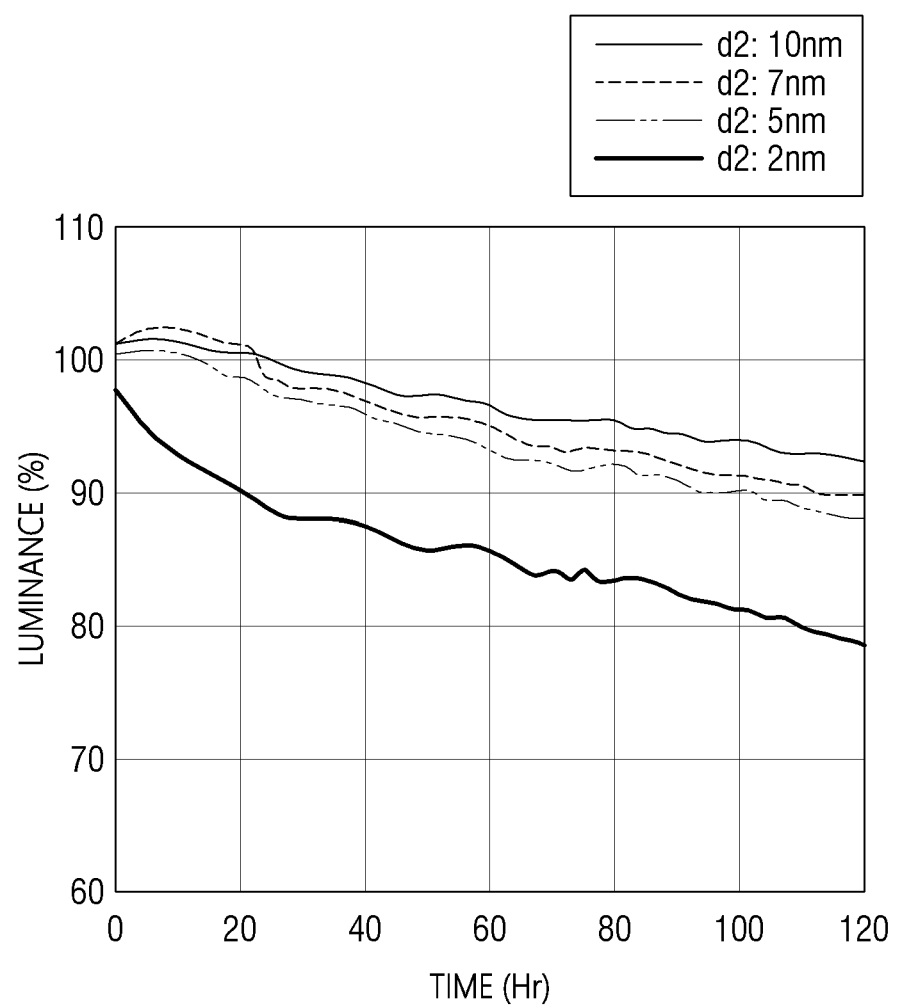
FIG. 5 is a graph showing luminance change over time for different thicknesses of a first insulating film.

FIG. 1 is a schematic perspective view of a light-emitting element according to an embodiment of the disclosure. FIG. 2 is a schematic cross-sectional view showing the light-emitting element according to the embodiment of the disclosure. FIG. 3 is a graph showing current density-internal quantum efficiency versus dielectric constant of an interlayer dielectric film. FIG. 4 is a graph showing luminance change over time for different thicknesses of an insulating film. FIG. 5 is a graph showing luminance change over time for different thicknesses of a first insulating film.

Referring to FIGS. 1 and 2, the light-emitting diode ED may be a particulate element, and may have a rod-like or cylindrical shape having a predetermined (or selectable) aspect ratio. The light-emitting diode ED may have a shape extended in one direction DR3. The length of the light-emitting diode ED in the extending direction (or longitudinal direction, DR3) may be greater than the diameter of the light-emitting diode ED. It should be understood, however, that the disclosure is not limited thereto. The length of the light-emitting diode ED in the extending direction DR3 may be approximately 1 µm to approximately 10 µm, or approximately 4 µm to approximately 5 µm. The diameter of the light-emitting diode ED may be about 500 nm. The aspect ratio of the light-emitting diode ED may be about 1.2:1 to about 100:1, but the disclosure is not limited thereto. For example, the light-emitting diode ED may have a shape of a rod, wire, tube, etc., a shape of a polygonal column such as a cube, a cuboid and a hexagonal column, or may have a shape extended in a direction with partially inclined outer surface. In the following description and the drawings for illustrating the shape of the light-emitting diode ED, the terms of one direction DR3, the extension direction DR3 of the light-emitting diode ED, and the longitudinal direction DR3 of the light-emitting diode ED may be used interchangeably.

The light-emitting diode ED may have a size of a nanometer scale (from 1 nm to 1 µm) to a micrometer scale (from 1 µm to 1 mm). According to an embodiment of the disclosure, both of the diameter and length of the light-emitting diode ED may have nanometer scales or micrometer scales. In some other embodiments, the diameter of the light-emitting diode ED may have a nanometer scale, while the length of the light-emitting diode ED may have a micrometer scale. In some embodiments, the diameter and/or length of some of the light-emitting elements ED may have nanometer scales, while the diameter and/or length of some others of the light-emitting diodes ED have micrometer scales.

According to an embodiment of the disclosure, the light-emitting diode ED may be an inorganic light-emitting diode. The inorganic light-emitting diode may include multiple semiconductor layers. For example, the inorganic light-emitting diode may include a first conductivity type (e.g., n-type) semiconductor layer, a second conductivity type (e.g., p-type) semiconductor layer, and an active semiconductor layer interposed therebetween. The active semiconductor layer may receive holes and electrons from the first conductivity-type semiconductor layer and the second conductivity-type semiconductor layer, respectively, and the holes and electrons reaching the active semiconductor layer may be combined to emit light. Inorganic light-emitting diodes may be aligned between two electrodes facing each other as polarities are created by forming an electric field in a particular direction between the two electrodes.

The light-emitting diode ED may include a core 30, an interlayer dielectric film 39, a first element insulating film 381, and a second element insulating film 382.

The core 30 may have a shape extended in one direction DR3. The core 30 may have a rod or cylindrical shape. It should be understood, however, that the disclosure is not limited thereto. The core 30 may have a polygonal column shape such as a cube, a cuboid and a hexagonal column, or may have a shape extended in the direction DR3 with an outer surface partially inclined.

The core 30 may include a first semiconductor layer 31, a second semiconductor layer 32, an emissive layer 33 and an element electrode layer 37. The first semiconductor layer 31, the emissive layer 33, the second semiconductor layer 32 and the element electrode layer 37 may be sequentially stacked each other in the direction DR3 which is the longitudinal direction of the core 30.

The first semiconductor layer 31 may be an n-type semiconductor. The first semiconductor layer 31 may include a semiconductor material having the following chemical formula: $Al_xGa_yIn_{1-x-y}N$ ($0 \le x \le 1$, $0 \le y \le 1$, $0 \le x+y \le 1$). For example, the first semiconductor layer 31 may include one or more of AlGaInN, GaN, AlGaN, InGaN, AlN and InN doped with n-type dopant. The n-type dopant doped into the first semiconductor layer 31 may be Si, Ge, Sn, Se, etc.

The second semiconductor layer 32 may be disposed above the first semiconductor layer 31 with the emissive layer 33 therebetween. The second semiconductor layer 32 may be a p-type semiconductor, and may include a semiconductor material having the following chemical formula: $Al_xGa_yIn_{1-x-y}N$ ($0 \le x \le 1$, $0 \le y \le 1$, $0 \le x+y \le 1$). For example, the second semiconductor layer 32 may include one or more of AlGaInN, GaN, AlGaN, InGaN, AlN and InN doped with p-type dopant. The p-type dopant doped into the second semiconductor layer 32 may be Mg, Zn, Ca, Ba, etc.

Although each of the first semiconductor layer 31 and the second semiconductor layer 32 is implemented as a signal layer in the drawings, the disclosure is not limited thereto.

Depending on the material included in the emissive layer 33, the first semiconductor layer 31 and the second semiconductor layer 32 may further include more than one layer, e.g., a clad layer or a tensile strain barrier reducing (TSBR) layer.

The emissive layer 33 may be disposed between the first semiconductor layer 31 and the second semiconductor layer 32. The emissive layer 33 may include a material having a single or multiple quantum well structure. In case that the emissive layer 33 includes a material having multiple quantum well structure, the structure may include quantum layers and well layers alternately stacked each other. The emissive layer 33 may emit light as electron-hole pairs are combined therein in response to an electrical signal applied through the first semiconductor layer 31 and the second semiconductor layer 32. The emissive layer 33 may include a material such as AlGaN, AlGaInN, or InGaN. In particular, in case that the emissive layer 33 has a multi-quantum well structure in which quantum layers and well layers are alternately stacked each other, the quantum layers may include AlGaN or AlGaInN, and the well layers may include a material such as GaN or AlGaN.

The emissive layer 33 may have a structure in which a semiconductor material having a large band gap energy and a semiconductor material having a small band gap energy are alternately stacked each other, and may include Group III to Group V semiconductor materials depending on the wavelength range of the emitted light. Accordingly, the light emitted from the emissive layer 33 is not limited to the light of the blue wavelength band. The emissive layer 36 may emit light of red or green wavelength band in some embodiments.

The light emitted from the emissive layer 33 may emit not only through the end surfaces of the light-emitting diode ED in the third direction DR3 which is the longitudinal direction but also through the side surfaces of the light-emitting diode ED. The direction in which the light emitted from the emissive layer 33 is not limited to one direction.

The element electrode layer 37 may be an ohmic connection electrode. It is, however, to be understood that the disclosure is not limited thereto. The element electrode layer 37 may be a Schottky connection electrode. The light-emitting diode ED may include at least one element electrode layer 37. The light-emitting diode ED may include one or more electrodes layers 37. It is, however, to be understood that the disclosure is not limited thereto. The element electrode layer 37 may be eliminated.

The element electrode layer 37 may be disposed between the second semiconductor layer 32 and electrodes to reduce the resistance in case that the both ends of the light-emitting diode ED are electrically connected to the electrodes to apply electric signals to the first and second semiconductor layers 31 and 32. The element electrode layer 37 may include metal having conductivity. For example, the element electrode layer 37 may include at least one of aluminum (Al), titanium (Ti), indium (In), gold (Au), silver (Ag), ITO, IZO and ITZO.

The interlayer dielectric film 39 may be disposed to surround the side surface (or outer circumferential surface) of the core 30. The interlayer dielectric film 39 may be disposed to surround the side surfaces of the multiple semiconductor layers or the element electrode layer 37 included in the core 30. The interlayer dielectric film 39 may be disposed to surround at least side surfaces of the first semiconductor layer 31, the emissive layer 33 and the second semiconductor layer 32, and may be extended in one direction DR3 in which the core 30 is extended.

The interlayer insulating film 39 may surround the side surface of the core 30 and may expose both end surfaces of the core 30 (top and bottom surfaces of the core 30 in FIG. 1). Since the interlayer dielectric film 39 is not disposed on both end surfaces of the core 30, the element electrode layer 37 and the first semiconductor layer 31 of the core 30 may be exposed by the interlayer insulating film 39.

The interlayer dielectric film 39 may be in direct contact with the side surface of the core 30. The interlayer dielectric film 39 may be disposed between the core 30 and the first element insulating film 381. For example, the inner surface of the interlayer dielectric film 39 may be in direct contact with the side surface (or outer circumferential surface) of the core 30, and the outer surface of the interlayer dielectric film 39 may be in direct contact with the inner surface of the first element insulating film 381.

The interlayer dielectric film 39 may include a material having an insulating property. According to an embodiment of the disclosure, the interlayer dielectric film 39 may include an insulating material that has an energy gap (or band gap) of about 3 electron volts (eV) or more and a high dielectric constant (high-k). As used herein, the term high dielectric constant may mean that the dielectric constant k is about 10 or more. In other words, the interlayer dielectric film 39 may include an oxide-based insulating material having a dielectric constant (or permittivity) of about 10 or more. For example, the interlayer dielectric film 39 may include hafnium silicon oxide ($HfSiO_x$), scandium oxide ($Sc_xO_y$), hafnium oxide ($HfO_x$), zirconium oxide ($ZrO_x$), strontium oxide (SrO), yttrium oxide ($Y_xO_y$), tantalum oxide ($Ta_xO_y$), barium oxide (BaO), tungsten oxide ($WO_x$), titanium oxide ($TiO_x$), lanthanum oxide ($La_xO_y$), etc.

The interlayer insulating film 39 may be in direct contact with the side surface of the core 30, it may be possible to improve the issue of surface defects formed on the side surface of the core 30. Such surface defects formed on the side surface of the core 30 may be generated on the surfaces of the first semiconductor layer 31, the second semiconductor layer 32, and the emissive layer 33 exposed to the outside during an etching process for forming the core 30 in the processes of fabricating the light-emitting diode ED, which will be described later. Such surface defect may result in a non-radiative recombination in which electrons and holes recombine without generating light on the surface of the core 30, thereby lowering the internal quantum efficiency (IQE) of the light-emitting diode ED.

According to the embodiment of the disclosure, the interlayer dielectric film 39 may include an oxide insulating material having an energy gap of about 3 electron volts (eV) or more and a dielectric constant of about 10 or more, thereby improving the issue of surface defects and increasing internal quantum efficiency. The insulating material having a high dielectric constant may increase the dielectric polarization that the positive and negative charges inside the insulating material have directivity by an external electric field. Accordingly, non-radiative recombination occurring on the side surface of the core 30 may be suppressed, and the leaked electrons may serve as a passage to the emissive layer 33, so that the internal quantum efficiency of the light-emitting diode ED may be improved.

Referring to the graph of FIG. 3, the x-axis represents the current density (in $A/cm^2$) applied to the light-emitting diode ED, and the y-axis represents the internal quantum efficiency (in %).

In case that the interlayer dielectric film 39 comprises an insulating material having a high dielectric constant (high-k), the internal quantum efficiency of the light-emitting diode ED may be approximately 15%. In other embodiments, in case that the interlayer dielectric film 39 includes an insulating material having a low dielectric constant (low-k), the internal quantum efficiency may be approximately 10%. As used herein, the term low dielectric constant may refer to a dielectric constant that is small than a high dielectric constant, and a dielectric constant (k) less than about 10. For example, the insulating material having a low dielectric constant may be aluminum nitride (AlN), silicon oxide ($SiO_x$), etc.

Referring back to FIGS. 1 and 2, the first element insulating film 381 may be disposed on the outer surface (or outer circumferential surface) of the interlayer dielectric film 39. The first element insulating film 381 may surround the outer surface of the interlayer dielectric film layer 39. The first element insulating film 381 may be disposed between the interlayer dielectric film 39 and the second element insulating film 382.

The first element insulating film 381 may be extended in one direction DR3. Similar to the interlayer dielectric film 39, the first element insulating film 381 may cover the side surface of the core 30 while exposing both end surfaces of the core 30. Although the first element insulating film 381 is extended in the longitudinal direction DR3 of the light-emitting disposed ED to cover from the first semiconductor layer 31 to the side surface of the electrode layer 37 in the embodiment shown in the drawing, the disclosure is not limited thereto.

The first element insulating film 381 may include an insulating material serving as a barrier against oxygen introduced from the second element insulating film 382. According to an embodiment of the disclosure, the first element insulating film 381 may be formed by plasma enhanced atomic layer deposition (PEALD) so that it may include a dense insulating material having a high thin-film density and a low impurity content. The first element insulating film 381 may have low oxygen permeability. The first element insulating film 381 may include an oxide insulating film, for example, silicon oxide ($SiO_2$). The thin-film density of the first element insulating film 381 may be higher than the thin-film density of the second element insulating film 382. The first element insulating film 381 may have a high thin-film density in order to prevent oxygen from permeating from the second element insulating film 382 having a relatively low thin-film density.

In case that oxygen introduced from the outside permeates into the light-emitting diode ED, the light-emitting diode ED may deteriorate, and the reliability of the light-emitting diode ED may be reduced. According to an embodiment of the disclosure, the first element insulating film 381 may be disposed between the insulating film 39 and the second element insulating film 382 to surround the outer surface of the core 30, so that it is possible to prevent the diffusion of oxygen into the interlayer dielectric film 39 or the core 30 from the second element insulating film 382. Accordingly, it is possible to improve the issue of deterioration and the reliability of the light-emitting diode ED.

The second element insulating film 382 may be disposed on an outer surface (or an outer circumferential surface) of the first element insulating film 381. The second element insulating film 382 may surround the outer surface of the first element insulating film 381.

The second element insulating film 382 may be extended in one direction DR3. Similar to the interlayer dielectric film 39 and the first element insulating film 381, the second element insulating film 382 may cover the side surface of the core 30 while exposing both end surfaces of the core 30. Although the second element insulating film 382 is extended in the longitudinal direction DR3 of the light-emitting disposed ED to cover from the first semiconductor layer 31 to the side surface of the element electrode layer 37 in the embodiment shown in the drawing, the disclosure is not limited thereto.

The second element insulating film 382 may protect the first element insulating film 381. For example, the second element insulating film 382 may be disposed to surround the outer surface of the first element insulating left 381, so that it is possible to prevent the first element insulating film 381 and/or the core 30 from being damaged during a process of forming the second insulating layer 520 (shown in FIG. 17) and/or other elements of the display device 10 in the processes of the fabricating the display device 10 to be described later.

Although the second element insulating film 382 is disposed to completely cover the outer surface of the first element insulating film 381 in the drawings, the disclosure is not limited thereto.

The second element insulating film 382 may include a material having an insulating property. For example, the second element insulating film 382 may include aluminum oxide ($Al_2O_3$), etc. The second element insulating film 382 may include, but is not limited to, a material that has a slower etch rate than that of the first element insulating film 381 with respect to an etchant (e.g., $F^2$ gas) used during a dry etching process in the processes of fabricating the display device 10 to be described later. Accordingly, even though the second element insulating film 382 forming the outermost surface of the light-emitting diode ED is exposed to the etchant used in the process of fabricating the display device 10, the etch rate of the second element insulating film with respect to the etchant may be slower, so that the second element insulating film 382 may stably protect the core 30 and the first element insulating film 381.

Referring to FIG. 2 in conjunction with FIGS. 4 and 5, the interlayer dielectric film 39, the first element insulating film 381 and the second element insulating film 382 may be formed to have a predetermined (or selectable) thickness, so that the emission efficiency and the reliability of the light-emitting diode ED may be improved. The thickness d1 of the interlayer dielectric film 39, the thickness d2 of the first element insulating film 381, and the thickness d3 of the second element insulating film 382 may be larger or smaller than one another.

Referring to FIG. 4, the thickness d1 of the insulating film 39 may be smaller than the thickness d2 of the first element insulating film 381 and the thickness d3 of the second element insulating film 382. For example, the thickness d1 of the interlayer dielectric film 39 may be less than or equal to about 5 nm, or about 2 nm or less. Accordingly, diffusion of oxygen from the interlayer dielectric film 39 including the oxide insulating material to the core 30 may be prevented, thereby improving the reliability of the light-emitting diode ED.

As the thickness d1 of the interlayer dielectric film 39 increases, the absolute amount of the oxygen components of the oxide insulating material included in the interlayer dielectric film 39 may increase. If the oxygen components included in the interlayer dielectric film 39 is introduced into the light-emitting diode ED, oxygen may diffuse from the insulating layer to the core 30 as described above, such that the light-emitting diode ED may deteriorate and the reliability may be lowered. For this reason, if the thickness d1 of the interlayer dielectric film 39 is about 5 nm or more, the reliability of the light-emitting diode ED may be deteriorated.

The graph of FIG. 4 shows the rate of change of the luminance (y-axis) of the light-emitting diode ED over time (x-axis) in case that the thickness d1 of the interlayer dielectric film 39 is 2 nm, 5 nm and 7 nm (current density: 50 A/cm$^2$).

In case that the thickness d1 of the interlayer dielectric film 39 is 5 nm or 7 nm, the luminance of the light-emitting diode ED may decrease linearly or exponentially over time. For example, in case that the thickness d1 of the interlayer dielectric film 39 is 5 nm or 7 nm, the luminance of the light-emitting diode ED may decrease to about 60% after 600 hours. On the other hand, in case that the thickness d1 of the insulating film 39 is 2 nm, the luminance of the light-emitting diode ED may decrease less over time.

It can be seen from FIG. 4 that as the thickness d1 of the interlayer dielectric film 39 decreases from 5 nm to 2 nm, the rate of decrease in luminance of the light-emitting diode ED over time decreases, and that the rate of decrease in luminance of the light-emitting diode ED may be reduced in case that the thickness d1 of the interlayer dielectric film 39 is 2 nm or less.

In order to conduct the deposition process of the interlayer dielectric film 39, the thickness of the interlayer dielectric film 39 may be at least about 0.1 nm or more.

In view of the above, in case that the thickness d1 of the interlayer dielectric film 39 is in the range of 0.1 nm to 5 nm, especially in the range of 0.1 nm to 2 nm, it is possible to reduce a decrease in luminance of the light-emitting diode ED over time, and to improve the issue of deterioration of the light-emitting diode ED. Accordingly, the light-emitting diode ED having improved reliability may be implemented.

Referring to FIG. 5, according to the embodiment of the disclosure, the thickness d2 of the first element insulating film 381 may be smaller than the thickness d3 of the second element insulating film 382. The thickness d2 of the first element insulating film 381 and the thickness d3 of the second element insulating film 382 may maintain a predetermined (or selectable) ratio, thereby improving the emission efficiency despite surface defects of the light-emitting diode ED, and the reliability despite oxygen diffusion.

For example, the ratio of the thickness d2 of the first element insulating film 381 to the thickness d3 of the second element insulating film 382 may be, but is not limited to, about 1:2 to about 1:8. The ratio may be about 1:4 or less. For example, in case that the thickness d3 of the second element insulating film 382 is about 40 nm, the thickness d2 of the first element insulating film 381 may be within the range of about 5 nm to about 10 nm, but the disclosure is not limited thereto. The thickness d2 of the first element insulating film 381 may be about 10 nm.

The graph of FIG. 5 shows the rate of change in luminance (y-axis) of the light-emitting diode ED over time (x-axis) in case that the thickness d2 of the first element insulating film 381 is 10 nm, 7 nm, 5 nm, and 2 nm. In this example, the thickness d3 of the second element insulating film 382 is 40 nm.

In case that the thickness d2 of the first element insulating film 381 is 10 nm, 7 nm, or 5 nm, the decrease in luminance of the light-emitting diode ED over time may be about 10%. In particular, in case that the thickness d2 of the first element insulating film 381 is 5 nm, the decrease in luminance of the light-emitting diode ED may be the smallest. On the other hand, in case that the thickness d2 of the first element insulating film 381 is 2 nm, the decrease in luminance of the light-emitting diode ED over time may be about 20% or more.

In view of the above, if the thickness d2 of the first element insulating film 381 is smaller than ⅛ times the thickness d3 of the second element insulating film 382, it may be difficult for the first element insulating film 381 to prevent diffusion of introduced oxygen from the second element insulating film 382. Accordingly, the ratio of the thickness d2 of the first element insulating film 381 to the thickness d3 of the second element insulating film 382 may be about 1:8, or about 1:4.

The thickness d2 of the first element insulating film 381 may be smaller than the thickness d3 of the second element insulating film 382. The larger the thickness d2 of the first element insulating film 381 is, the longer the plasma atomic layer deposition (PEALD) process is. As a result, it is more likely that the surface defects of the light-emitting diode ED are caused by plasma damage. Therefore, the thickness d2 of the first element insulating film 381 may have such a thickness range that prevents surface defects of the light-emitting diode ED.

The light-emitting diode ED according to the embodiment may include the core 30, and the interlayer dielectric film 39, the first element insulating film 381, and the second element insulating film 382 surrounding the side surface of the core 30, so that the emission efficiency and the reliability of the light-emitting diode ED may be improved. The interlayer dielectric film 39 may include an oxide insulating material having a high dielectric constant having a thickness of less than about 5 nm, so that it is possible to improve the emission efficiency of the light-emitting diode ED by improving the issue of surface defects of the core 30, and to prevent deterioration of the reliability of the light-emitting diode ED. The second element insulating film 382 may include an insulating material having a slower etching rate with respect to an etchant used during a dry etching process, to protect the core 30 and the insulating films 39 and 381, and the first element insulating film 381 may prevent oxygen diffusion from the second element insulating film 382. In this manner, it is possible to improve the issue of the deterioration of the light-emitting diode ED and to ensure the reliability.

Figure 6:
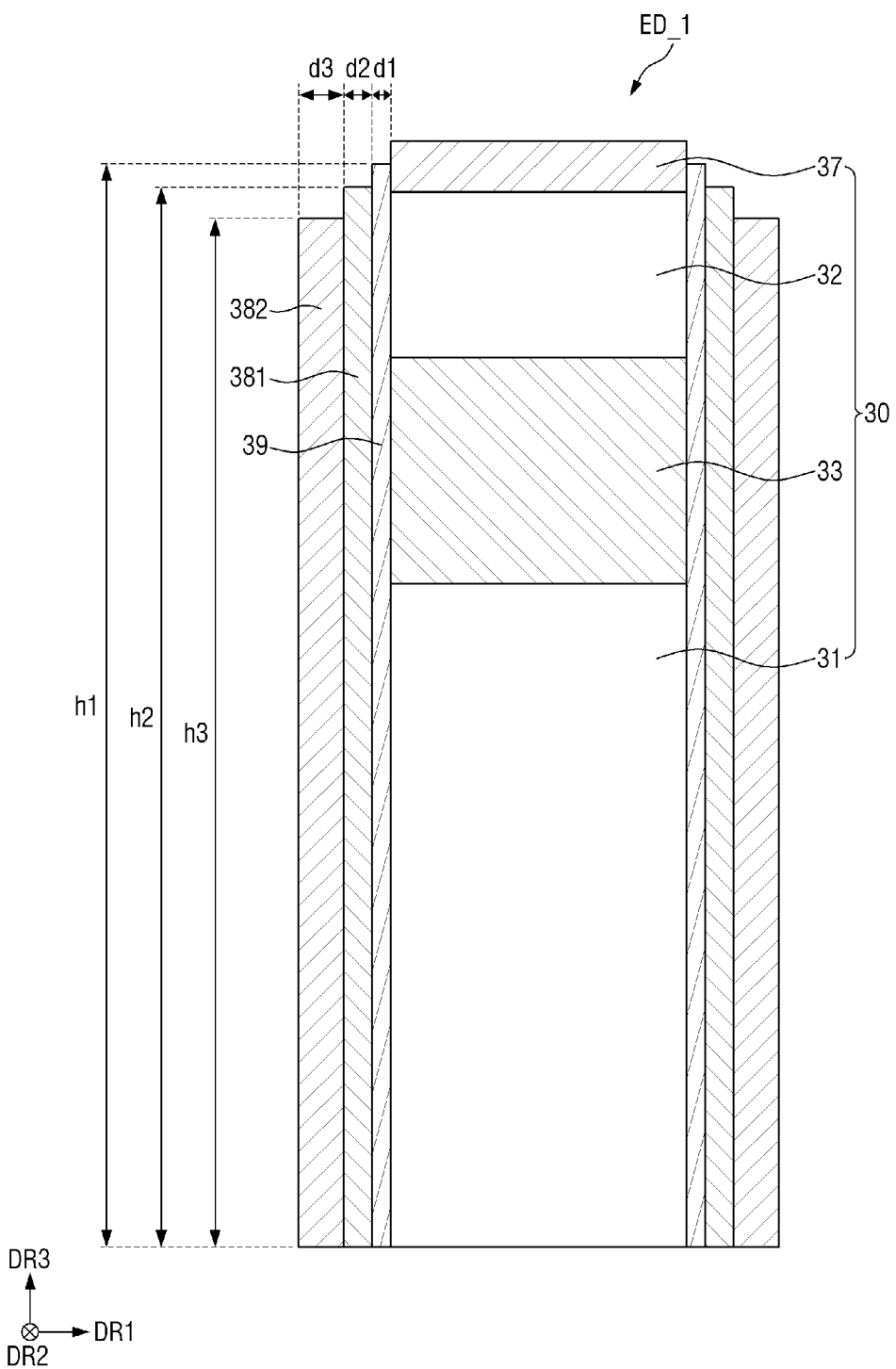
FIG. 6 is a schematic cross-sectional view of a light-emitting element according to another embodiment of the disclosure.
Figure 7:
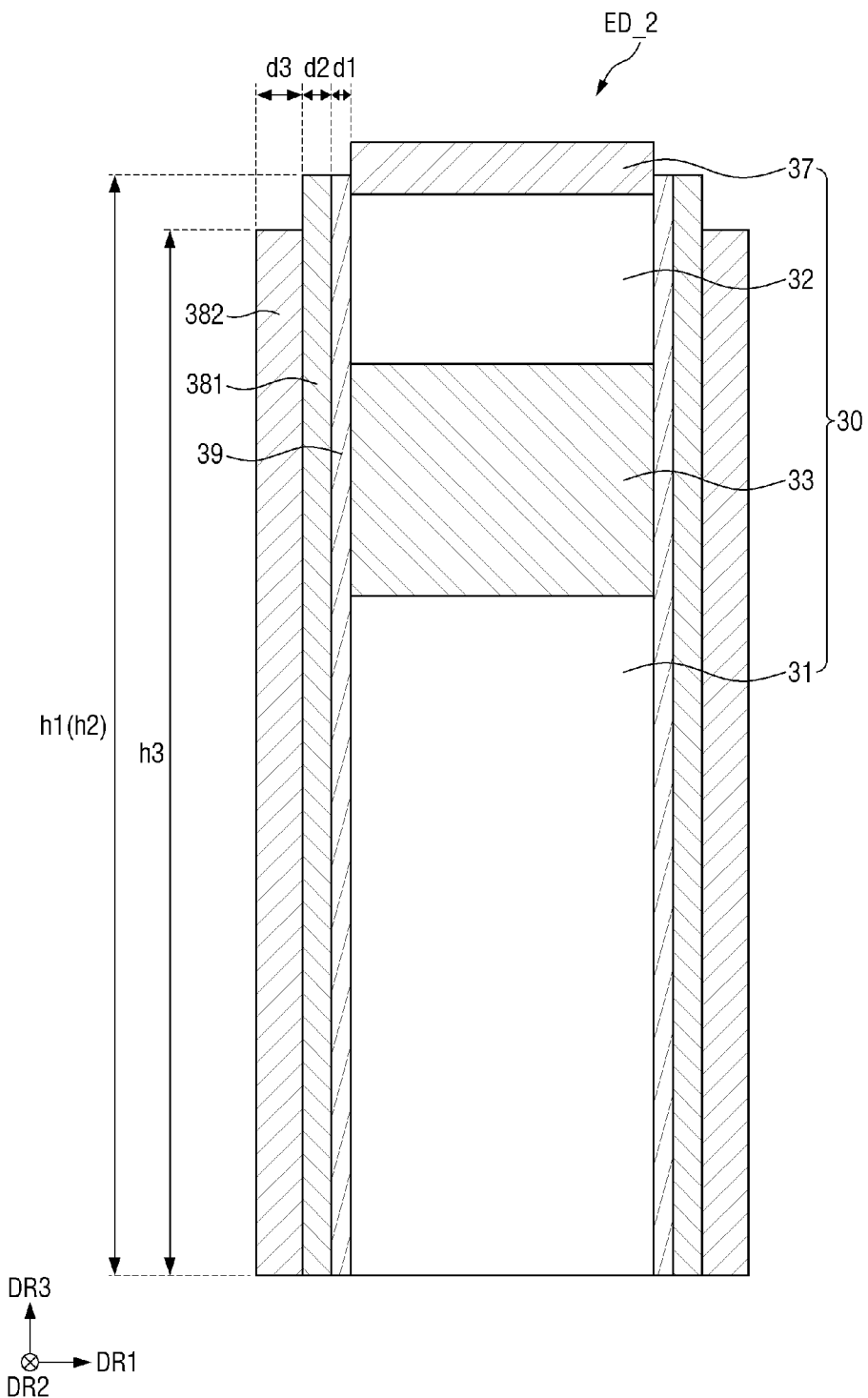
FIG. 7 is a schematic cross-sectional view of a light-emitting element according to yet another embodiment of the disclosure.
Figure 8:
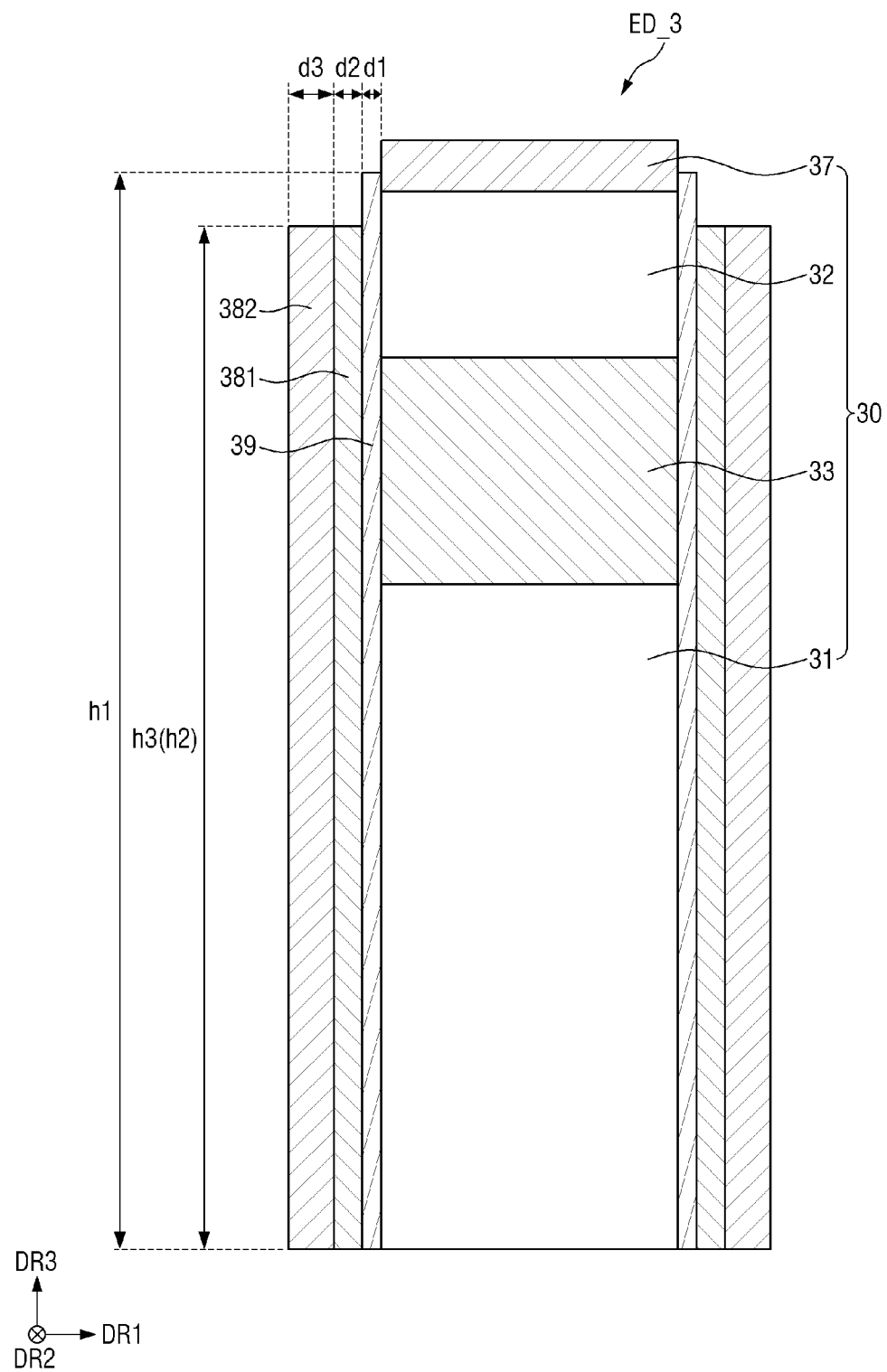
FIG. 8 is a schematic cross-sectional view of a light-emitting element according to still another embodiment of the disclosure.

FIG. 6 is a schematic cross-sectional view of a light-emitting element according to another embodiment of the disclosure. FIG. 7 is a schematic cross-sectional view of a light-emitting element according to yet another embodiment of the disclosure. FIG. 8 is a schematic cross-sectional view of a light-emitting element according to still another embodiment of the disclosure.

The lengths of the interlayer dielectric film 39, the first element insulating film 381 and the second element insulating film 382 of the light-emitting diode ED in the extension direction DR3 according to the embodiment may be all equal or different from one another. This embodiment is different from the above embodiment where the lengths of the interlayer dielectric film 39, the first element insulating film 381 and the second element insulating film 382 in the direction DR3 are equal to the length of the core 30.

According to the embodiments of FIGS. 6 to 8, the first element insulating film 381 may cover the side surfaces of only some part of the semiconductor layers including the emissive layer 33, or may cover a part of the side surface of the element electrode layer 37 while exposing another part of the side surface of the element electrode layer 37. For example, according to the etching process of insulating material layers 3900, 3810 and 3820 (see FIG. 10) of the light-emitting diode ED, which will be described later, not only the upper surface of the core 30 but also a portion of the side surface of the core 30 may be exposed. Accordingly, the length h1 of the interlayer dielectric film 39, the length h2 of the first element insulating film 381 and the length h3 of the second element insulating film 382 may be different from the length of the core 30.

Referring to FIG. 6, the length of the core 30 of a light-emitting diode ED 1 according to this embodiment may be longer than the length h1 of the interlayer dielectric film 39. The length h1 of the interlayer dielectric film 39 may be longer than the length h2 of the first element insulating film 381, and the length h2 of the first element insulating film 381 may be longer than the length h3 of the second element insulating layer 382.

Referring to FIG. 7, the length of the core 30 of a light-emitting diode ED 2 according to this embodiment may be longer than the length h1 of the interlayer dielectric film 39. The length h1 of the interlayer dielectric film 39 may be substantially equal to the length h2 of the first element insulating film 381. The length h1 of the interlayer dielectric film 39 or the length h2 of the first element insulating film 381 may be longer than the length h3 of the second element insulating film 382.

Referring to FIG. 8, the length of the core 30 of a light-emitting diode ED_3 according to this embodiment may be longer than the length h1 of the interlayer dielectric film 39. The length h1 of the interlayer dielectric film 39 may be longer than the length h2 of the first element insulating film 381. The length h2 of the first element insulating film 381 may be substantially equal to the length h3 of the second element insulating film 382.

Hereinafter, processing steps of fabricating the light-emitting diode ED will be described with reference to other drawings.

FIGS. 9 to 14 are schematic cross-sectional views showing processing steps of a method of fabricating a light-emitting diode according to an embodiment of the disclosure.

A first direction DR1, a second direction DR2 and a third direction DR3 are defined in the drawings. The method of fabricating a light-emitting diode ED according to an embodiment of the disclosure will be described with reference to the drawings. The first direction DR1 and the second direction DR2 may be perpendicular to each other, and the third direction DR3 may be perpendicular to the plane where the first direction DR1 and the second direction DR2 are located. The third direction DR3 may be the extension direction (or the longitudinal direction) of the light-emitting diode ED or the one direction as described above.

In the following description of embodiments of processing steps of fabricating a light-emitting diode ED, the upper side may refer to the side in the third direction DR3 where multiple semiconductor layers of the light-emitting diode ED is stacked each other from the surface (or the upper surface) of the lower substrate 1000, and the upper surface may refer to the surface facing the side in the third direction DR3, unless specifically stated otherwise. The lower side may refer to the opposite side in the third direction DR3, and the lower surface may refer to a surface facing the opposite side in the third direction DR3.

Referring first to FIG. 9, a lower substrate 1000 may be prepared.

Specifically, the lower substrate 1000 may include a base substrate 1100 and a buffer material layer 1200 disposed on the base substrate 1100.

The base substrate 1100 may include a transparent substrate such as a sapphire substrate ($Al_xO_y$) and a glass substrate. It is, however, to be understood that the disclosure is not limited thereto. The base substrate 1100 may include a conductive material such as GaN, SiC, ZnO, Si, GaP and GaAs. In an embodiment, the base substrate 1100 may be a sapphire substrate ($Al_xO_y$).

The buffer material layer 1200 may be formed on a surface (or an upper surface) of the base substrate 1100. The buffer material layer 1200 may reduce a lattice constant difference between a first semiconductor material layer 3100 and the base substrate 1100 formed thereon.

For example, the buffer material layer 1200 may include an undoped semiconductor. The buffer material layer 1200 and the first semiconductor material layer 310 may include substantially the same material, which is not doped with n-type or p-type, or which may have a doping concentration smaller than that of the first semiconductor material layer 310. In an embodiment, the buffer material layer 1200 may include, but is not limited to, at least one of InAlGaN, GaN, AlGaN, InGaN, AlN and InN.

Multiple semiconductor material layers may be formed on the lower substrate 1000. The multiple semiconductor material layers grown by an epitaxial process may be formed by growing a seed crystal. The method of forming the semiconductor material layers may include an electron beam deposition method, physical vapor deposition (PVD), chemical vapor deposition (CVD), plasma laser deposition (PLD), dual-type thermal evaporation, sputtering, metal-organic chemical vapor deposition (MOCVD), etc. The method may be carried out by metal-organic chemical vapor deposition (MOCVD). It is, however, to be understood that the disclosure is not limited thereto.

A precursor material for forming the semiconductor material layers is not particularly limited and any typical material may be selected as long as it can form a target material. For example, the precursor material may include a metal precursor including an alkyl group such as a methyl group or an ethyl group. For example, like the light-emitting diode ED according to the embodiment, in an embodiment where the first semiconductor layer 31, the second semiconductor layer 32 and the emissive layer 33 include one of AlGaInN, GaN, AlGaN, InGaN, AlN and InN, the metal precursor may be trimethyl gallium ($Ga(CH_3)_3$), or a compound such as trimethyl aluminum ($Al(CH_3)_3$) and triethyl phosphate ($(C_2H_5)_3PO_4$). It is, however, to be understood that the disclosure is not limited thereto.

The multiple semiconductor material layers may be formed via a deposition process using the metal precursor or a non-metal precursor.

Subsequently, referring to FIG. 10, a first stack structure 3000 may be formed on the lower substrate 1000. Specifically, the first stacked structure may be formed on the lower substrate 1000, in which the first semiconductor material layer 3100, an emission material layer 3300, a second semiconductor material layer 3200, and an electrode material layer 3700 are sequentially stacked each other.

Multiple layers included in the first stack structure 3000 may correspond to the layers included in the core 30 according to the above embodiment, respectively. Specifically, the first semiconductor material layer 3100, the emission material layer 3300, the second semiconductor material layer 3200, and the electrode material layer 3700 of the first stack structure 3000 may correspond to the first semiconductor layer 31, the emissive layer 33, the second semiconductor layer 32, and the element electrode layer 37 of the core 30, respectively, and may include the same material as the materials of the layers, respectively.

Figure 11:
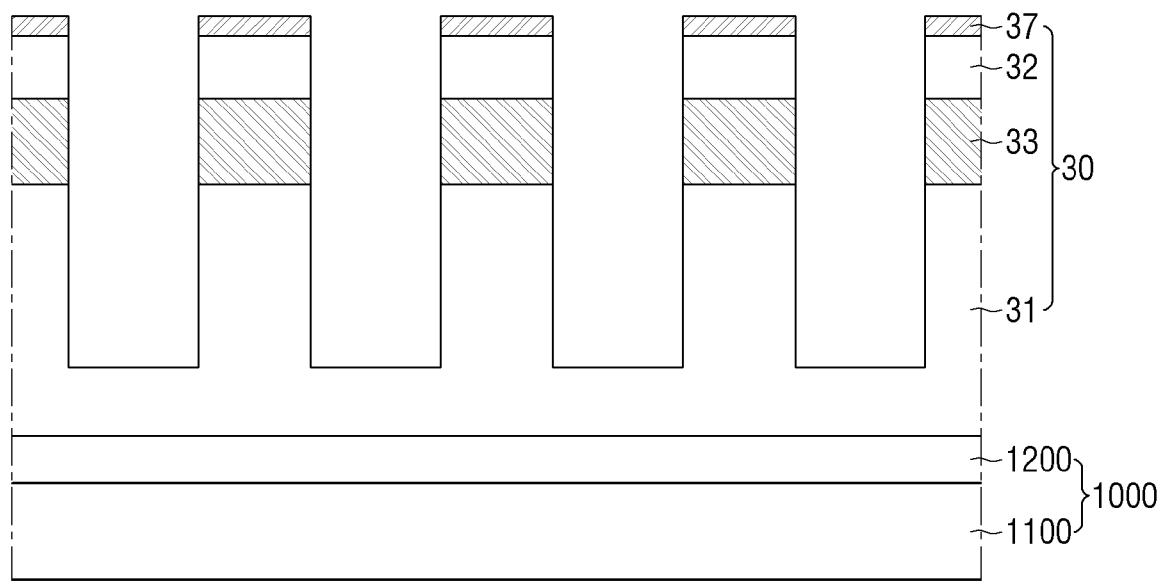

Subsequently, referring to FIG. 11, the first stack structure 3000 may be etched to form multiple cores 30 spaced apart from one another.

Specifically, the cores 30 spaced apart from one another may be formed by etching the first stack structure 3000 in the direction perpendicular to the upper surface of the lower substrate 1000, for example, in the third direction DR3. The first stack structure 3000 may be etched by a typical patterning method. For example, the patterning method may be performed by forming an etch mask layer above the first stack structure 3000 and etching the first stack structure 3000 along the etch mask layer in the third direction DR3.

For example, the process of etching the first stack structure 3000 may include dry etching, wet etching, reactive ion etching (RIE), inductively-coupled-plasma reactive ion etching (ICP-RIE), etc. The dry etching may allow for anisotropic etching, and thus it may be suitable for vertical etching. According to an embodiment of the disclosure, the etching of the first stack structure 3000 may be performed by the combination of dry etching and wet etching. For example, dry etching may be carried out in the third direction DR3, and then the etched sidewall may be placed on the plane perpendicular to the upper surface of the lower substrate 1000 by wet etching, which is isotropic etching.

In doing so, defects may occur on the surfaces of the multiple cores 30 formed by etching the first stack structure 3000 due to an etchant used in the etching process. Specifically, defects may occur on the semiconductor material on the surface of the semiconductor layer included in each of the multiple cores 30. For example, surface defects may occur on side surfaces of the first semiconductor layer 31, the second semiconductor layer 32, and the emissive layer 33 of the core 30. The surface defects may refer to defects generated on the surfaces of the multiple semiconductor layers of the cores 30 exposed to the etchant used in an etching process for forming the first stack structure 3000 into the multiple cores 30.

Figure 12:
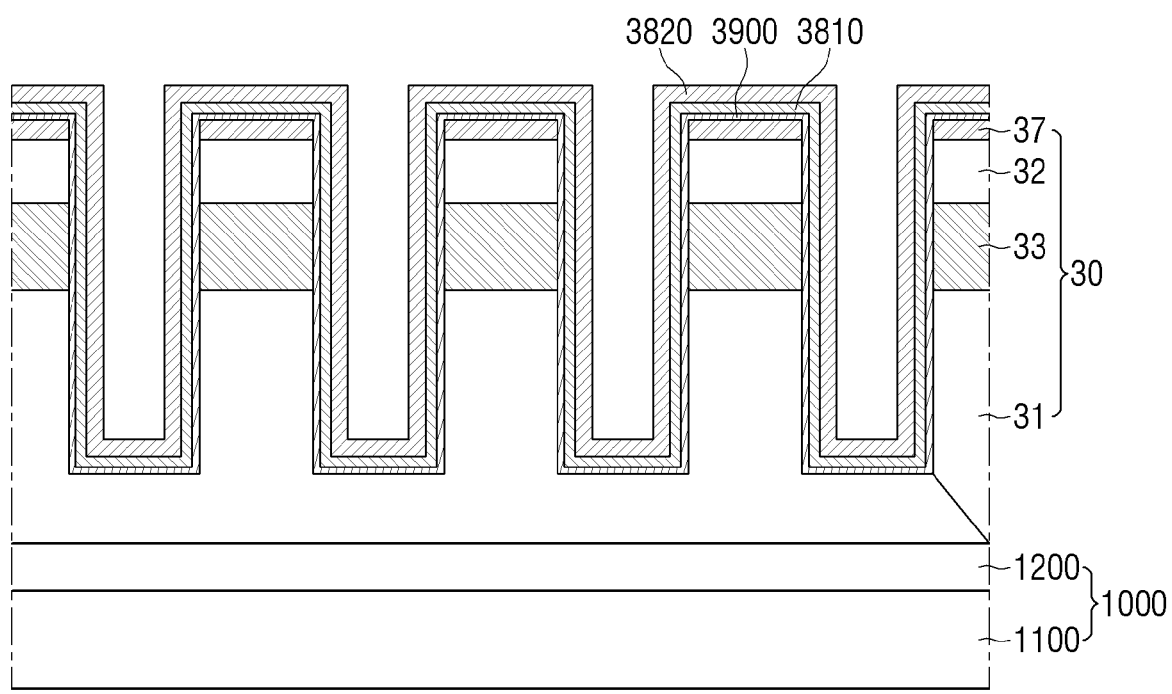

Subsequently, referring to FIG. 12, an interlayer insulating material layer 3900, a first insulating material layer 3810, and a second insulating material layer 3820 may be sequentially formed on the cores 30.

As described above, in order to improve the issue of surface defects on the outer surfaces of the semiconductor layers of the core 30 generated in the etching process for forming the cores 30, the core 30 may be formed and then the interlayer insulating material layer 3900 may be formed on the cores 30.

Initially, the interlayer insulating material layer 3900 may be formed on the multiple cores 30. The interlayer insulating material layer 3900 may be formed on the entire surface of the lower substrate 1000, and may be formed not only on the outer surface of the cores 30 but also on the upper surface of the lower substrate 1000 which may be exposed by the cores 30. The outer surfaces of the cores 30 may include the upper surface and the side surface of the cores 30. The interlayer insulating material layer 3900 may be disposed directly on the upper surface and the side surface of the cores 30. Accordingly, the interlayer insulating material layer 3900 may be directly disposed on side surfaces of the multiple semiconductor layers of the cores 30 to contact them.

The interlayer insulating material layer 3900 may correspond to the interlayer dielectric film 39 of the light-emitting diode ED via a subsequent process. Accordingly, the interlayer insulating material layer 3900 may include the material included in the interlayer dielectric film 39, e.g., an oxide insulating material that has an energy gap of about 3 electron volts (eV) or more and a dielectric constant (or permittivity) of about 10 or more. For example, the interlayer insulating material layer 3900 may include hafnium silicon oxide (HfSiO$_x$), scandium oxide (Sc$_x$O$_y$), hafnium oxide (HfO$_x$), zirconium oxide (ZrO$_x$), strontium oxide (SrO), yttrium oxide (Y$_x$O$_y$), tantalum oxide (Ta$_x$O$_y$), barium oxide (BaO), tungsten oxide (WO$_x$), titanium oxide (TiO$_x$), lanthanum oxide (La$_x$O$_y$), etc.

As described above, the interlayer insulating material layer 3900 may have a predetermined (or selectable) thickness to improve the efficiency without compromising the reliability of the light-emitting diode ED. For example, in order to prevent diffusion of the oxygen components included in the interlayer insulating material layer 3900 into the core 30, it may be formed to have a thickness in the range of about 5 nm or less.

For example, the interlayer insulating material layer 3900 may be formed by atomic layer deposition (ALD), thermal ALD, or plasma atomic layer deposition (PEALD).

Subsequently, a first insulating material layer 3810 and a second insulating material layer 3820 may be sequentially stacked each other on the interlayer insulating material layer 3900.

Specifically, a first insulating material layer 3810 may be formed on the outer surface of the interlayer insulating material layer 3900, and a second insulating material layer 3820 may be formed on the outer surface of the first insulating material layer 3810. The interlayer insulating material layer 3900 may be formed on the entire surface of the first insulating material layer 3810, and the second insulating material layer 3820 may be formed on the entire surface of the first insulating material layer 3810.

The first insulating material layer 3810 may correspond to the first element insulating film 381 of the light-emitting diode ED via a subsequent process, and the second insulating material layer 3820 may correspond to the second element insulating film 382 of the light-emitting diode ED via a subsequent process. Accordingly, the first insulating material layer 3810 may include a material included in the first element insulating film 381, for example, silicon oxide (SiO$_2$). The second insulating material layer 3820 may include a material included in the second element insulating film 382, for example, aluminum oxide (Al$_2$O$_3$).

For example, the first insulating material layer 3810 and the second insulating material layer 3820 may be formed by atomic layer deposition (ALD), thermal ALD, or plasma atomic layer deposition (PEALD).

According to an embodiment of the disclosure, the first insulating material layer 3810 may be formed by plasma atomic layer deposition (PEALD). Accordingly, the first insulating material layer 3810 may include a dense insulating material having a high thin-film density and a low impurity content. The first insulating material layer 3810 may prevent diffusion of oxygen introduced from the outside, thereby improving the issue of deterioration of the light-emitting diode ED.

The thickness of the first insulating material layer 3810 and the thickness of the second insulating material layer 3820 may have a predetermined (or selectable) ratio in order to improve the emission efficiency despite surface defects of the light-emitting diode ED and to improve the reliability despite oxygen diffusion. For example, the ratio of the thickness of the first insulating material layer 3810 to the thickness of the second insulating material layer 3820 may be about 1:2 to about 1:8, or about 1:4 or less. For example, in case that the thickness of the second insulating material layer 3820 is about 40 nm, the thickness of the first insulating material layer 3810 may be within the range of about 10 nm to about 5 nm, or about 10 nm or less.

Figure 13:
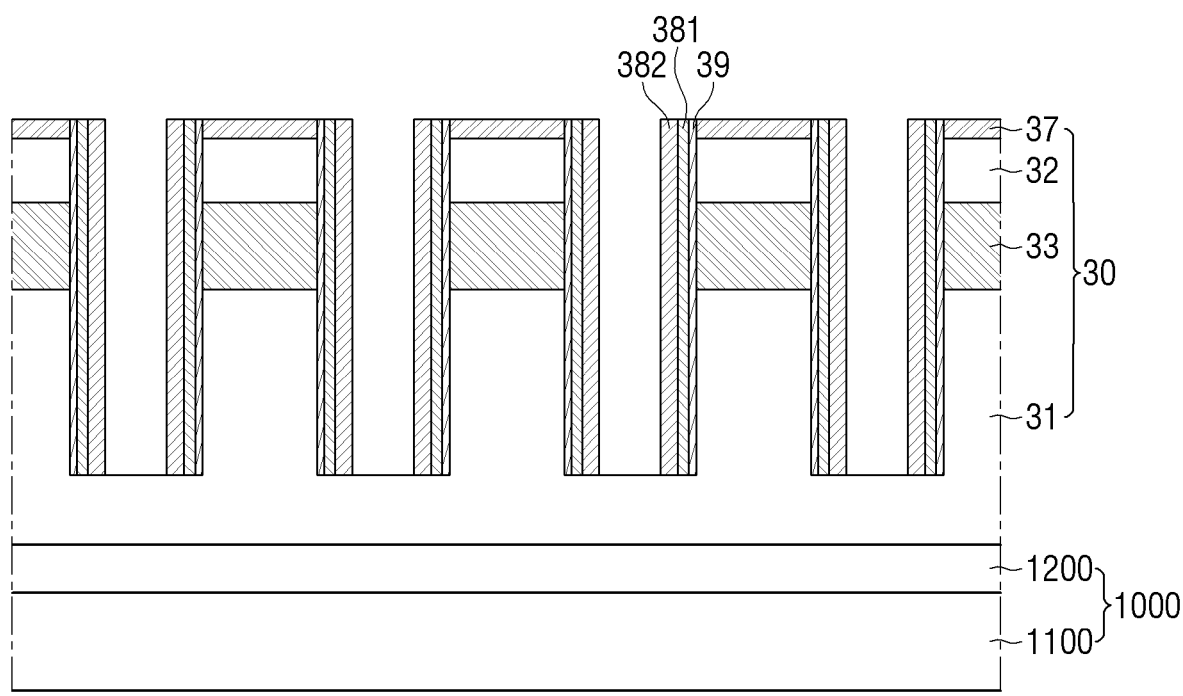

Subsequently, referring to FIG. 13, the interlayer insulating material layer 3900, the first insulating material layer 3810, and the second insulating material layer 3820 may be partially removed, so that an interlayer dielectric film 39, a first element insulating film 381 and a second element insulating film 382 surrounding the side surface of the core 30 are formed as shown in FIG. 1.

The process of forming the interlayer dielectric film 39, the first element insulating film 381, and the second element insulating film 382 may include an etching process of partially removing the interlayer insulating material layer 3900, the first insulating material layer 3810, and the second insulating material layer 3820 to expose one surface of the core 30, e.g., the upper surface of the element electrode layer 37. The process of partially removing the interlayer insulating material layer 3900, the first insulating material layer 3810 and the second insulating material layer 3820 may be carried out via an anisotropic etching process such as dry etching or etch back.

Although the upper surface of the element electrode layer 37 is exposed and the upper surfaces of the insulating films 3900, 3810 and 3820 are flat in the embodiment shown in the drawings, the disclosure is not limited thereto. According to the embodiments of FIGS. 6 to 8, the insulating films 39, 381 and 382 may be formed to have partially curved outer surfaces where they surround the element electrode layer 37. In the process of partially removing the insulating material layers 3900, 3810 and 3820, not only the upper surfaces but also the side surfaces of the insulating material layers 3900, 3810 and 3820 may be partially removed, so that the insulating material layers 3900, 3810 and 3820 surrounding the multiple layers may be formed with partially etched end surfaces. As the upper surfaces of the insulating material layers 3900, 3810 and 3820 are removed, the outer surfaces of the insulating films 3900, 3810 and 3820 adjacent to the element electrode layer 37 may be partially removed in the light-emitting diode ED. The lengths of the insulating films 3900, 3810 and 3820 may be all equal or different from one another.

Figure 14:
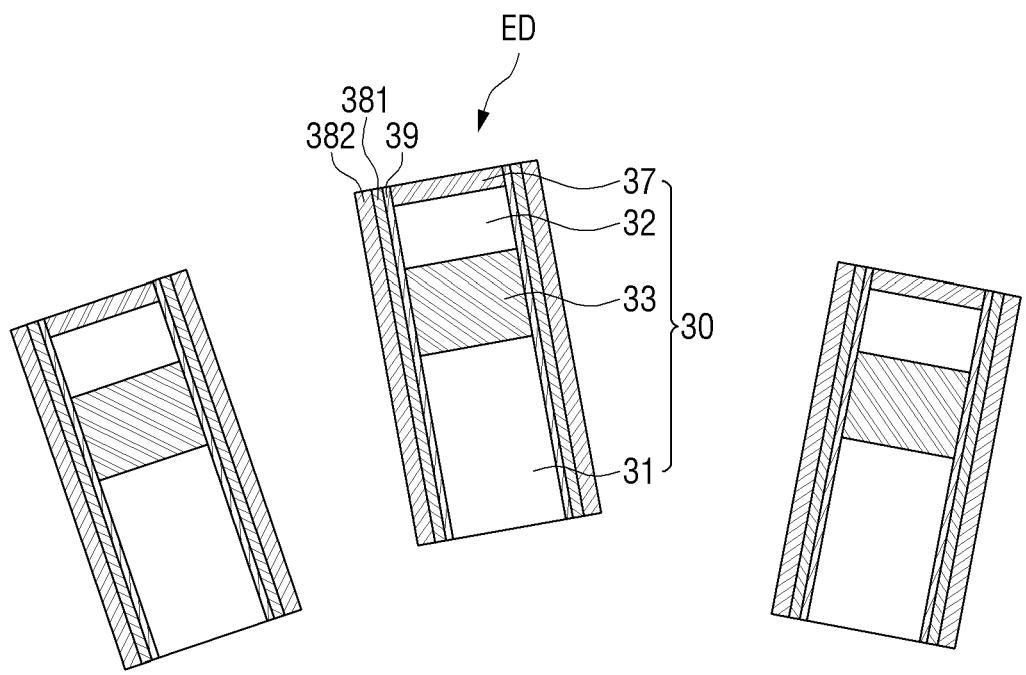

Subsequently, referring to FIG. 14, the multiple light-emitting diodes ED may be separated from the lower substrate 1000. The process of separating the multiple light-emitting diodes ED from the lower substrate 1000 is not particularly limited. For example, the process of separating the multiple light-emitting diodes ED may be performed by a physical separation method or a chemical separation method.

Figure 15:
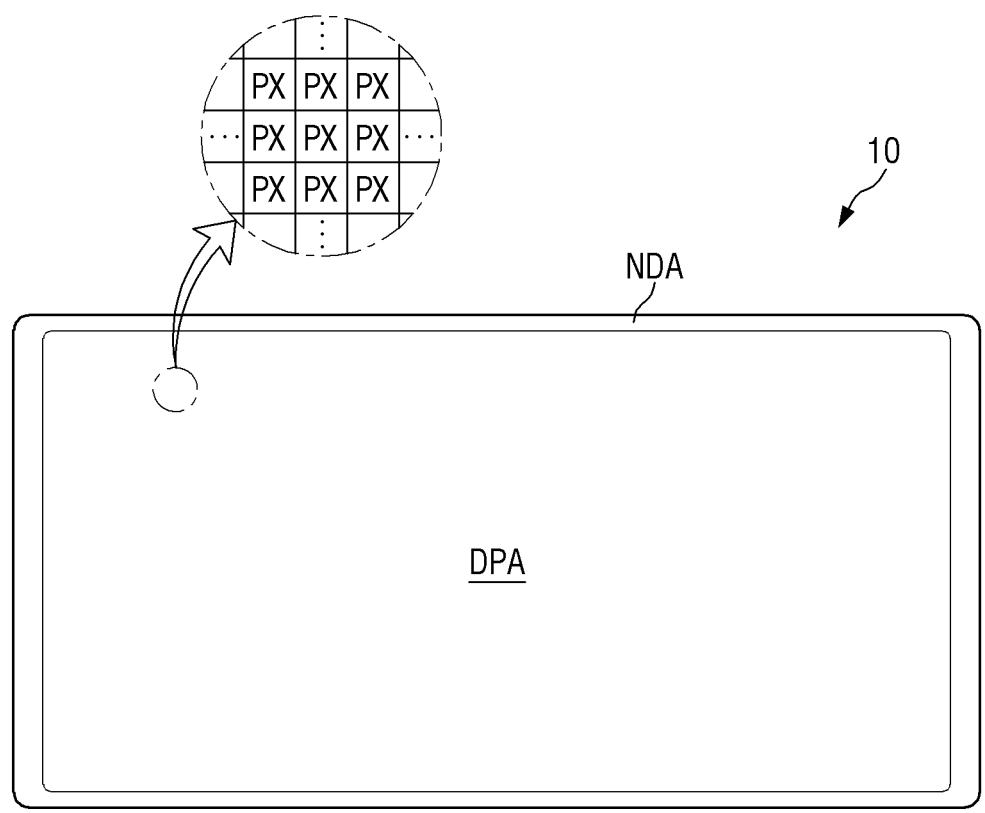
FIG. 15 is a plan view of a display device according to an embodiment of the disclosure.

FIG. 15 is a plan view of a display device according to an embodiment of the disclosure.

Referring to FIG. 15, a display device 10 may display a moving image or a still image. A display device 10 may refer to any electronic device that provides a display screen. For example, the display device 10 may include a television set, a laptop computer, a monitor, an electronic billboard, an Internet of Things devices, a mobile phone, a smart phone, a tablet personal computer (PC), an electronic watch, a smart watch, a watch phone, a head-mounted display device, a mobile communications terminal, an electronic notebook, an electronic book, a portable multimedia player (PMP), a navigation device, a game console and a digital camera, a camcorder, etc.

The display device 10 may include a display panel for providing a display screen. Examples of the display panel may include an inorganic light-emitting diode display panel, an organic light-emitting display panel, a quantum-dot light-emitting display panel, a plasma display panel, a field emission display panel, etc. In the following description, a display panel including the above-described light-emitting diode ED, specifically, an inorganic light-emitting diode is employed as an embodiment of the display panel, but the disclosure is not limited thereto. Any other display panel may be employed as long as the technical idea of the disclosure may be equally applied.

A fourth direction DR4, a fifth direction DR5 and a sixth direction DR6 are defined in the drawings. The display device 10 according to the embodiment of the disclosure will be described with reference to the drawings. The fourth direction DR4 and the fifth direction DR5 may be perpendicular to each other in one plane. The sixth direction DR6 may be perpendicular to the plane in which the fourth and fifth directions DR4 and DR5 are located. The sixth direction DR6 may be perpendicular to each of the fourth direction DR4 and the fifth direction DR5. In the following description of the display devices 10 according to the embodiments of the disclosure, the sixth direction DR6 may refer to the thickness direction of the display device 10.

The display device 10 may have a rectangular shape including longer sides in the fourth direction DR4 and shorter sides in the fifth direction DR5 in a plan view. Although the corners where the longer sides and the shorter sides of the display device 10 meet may form a right angle, this is merely illustrative. The display device 1 may have rounded corners. The shape of the display device 10 in a plan view is not limited to that shown. The display device 10 may have other shapes such as a square, a rectangle with rounded corners (vertices), other polygons and a circle.

A display surface may be located on one side of the display device 10 in the sixth direction DR6, i.e., the thickness direction. In the following description, the upper side of the display device 10 may refer to the side in the sixth direction DR6 where images are displayed, and the upper surface of the display device 10 may refer to the surface facing the side in the sixth direction DR6, unless specifically stated otherwise. The lower portion may refer to the opposite side in the sixth direction DR6, and the lower surface may refer to a surface facing the opposite side in the sixth direction DR6.

As used herein, the fourth direction DR4 may be parallel to the longitudinal direction (or the extension direction) of the light-emitting diode ED or the third direction DR3 in FIGS. 6 to 12. For example, the light-emitting diode ED extended in the third direction DR3 may be aligned in parallel to the fourth direction DR4 of the display device 10.

The display device 10 may include a display area DPA and a non-display area NDA. In the display area DPA, images may be displayed. In the non-display area NDA, images may be not displayed.

The shape of the display area DPA may follow the shape of the display device 10. For example, the shape of the display area DPA may have a rectangular shape generally similar to the shape of the display device 10 in a plan view. The display area DPA may generally occupy the majority of the center of the display device 10.

The display area DPA may include multiple pixels PX. The multiple pixels PX may be arranged in a matrix. The shape of each of the pixels PX may be rectangular or square in a plan view. It is, however, to be understood that the disclosure is not limited thereto. The shape of each of the pixels PX may have a diamond shape having the sides inclined with respect to one direction. The pixels PX may be arranged in stripes or the PenTile™ pattern alternately.

The non-display area NDA may be disposed adjacent to the display area DPA. The non-display area NDA may surround the display area DPA entirely or partially. According to an embodiment of the disclosure, the display area DPA may have a rectangular shape, and the non-display areas NDA may be disposed to be adjacent to the four sides of the display area DPA. The non-display area NDA may form a bezel of the display device 10. Lines, circuit drivers included in the display device 10, or pad areas on which external devices may be mounted may be disposed in the non-display areas NDA.

Figure 16:
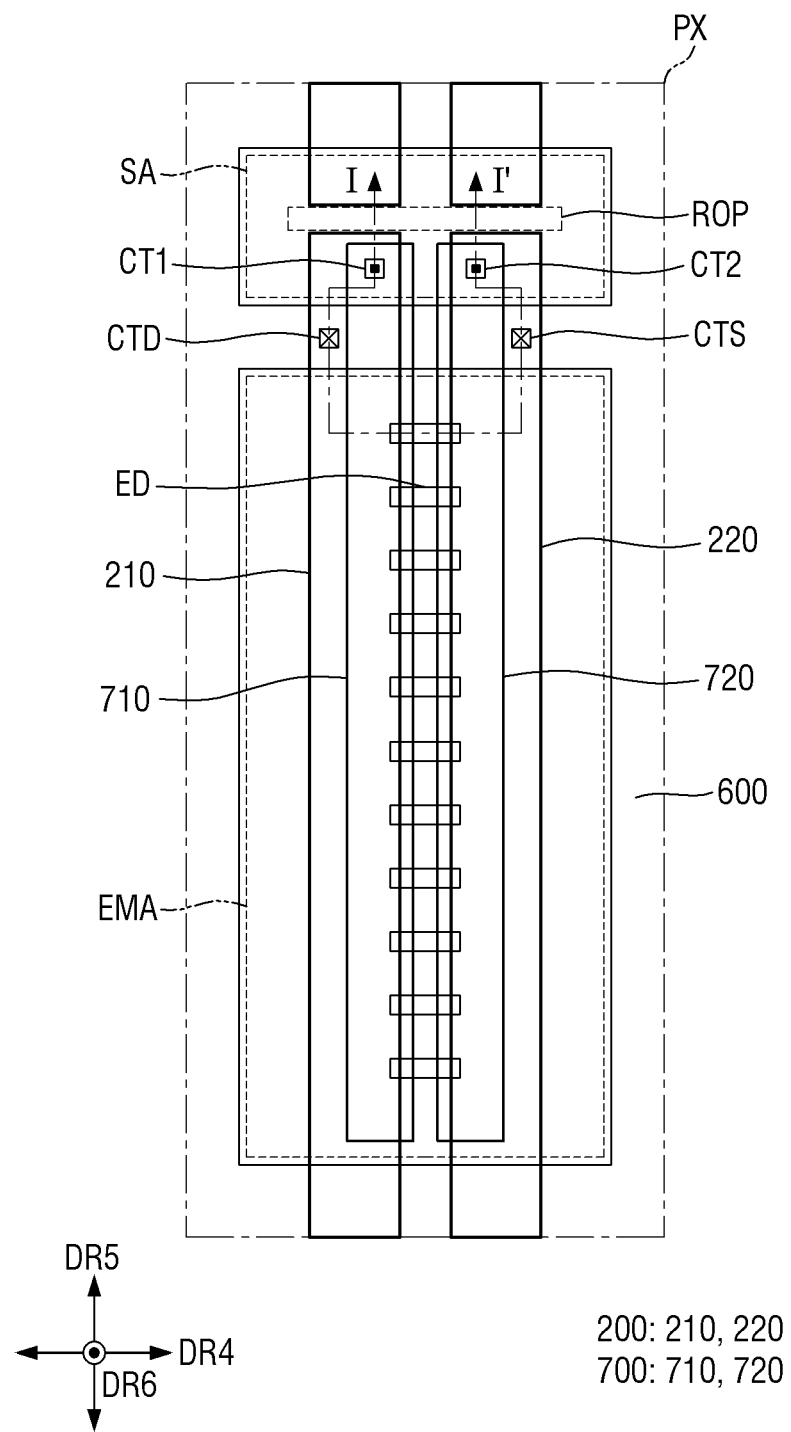
FIG. 16 is a layout view of a pixel of a display device according to an embodiment of the disclosure.
Figure 17:
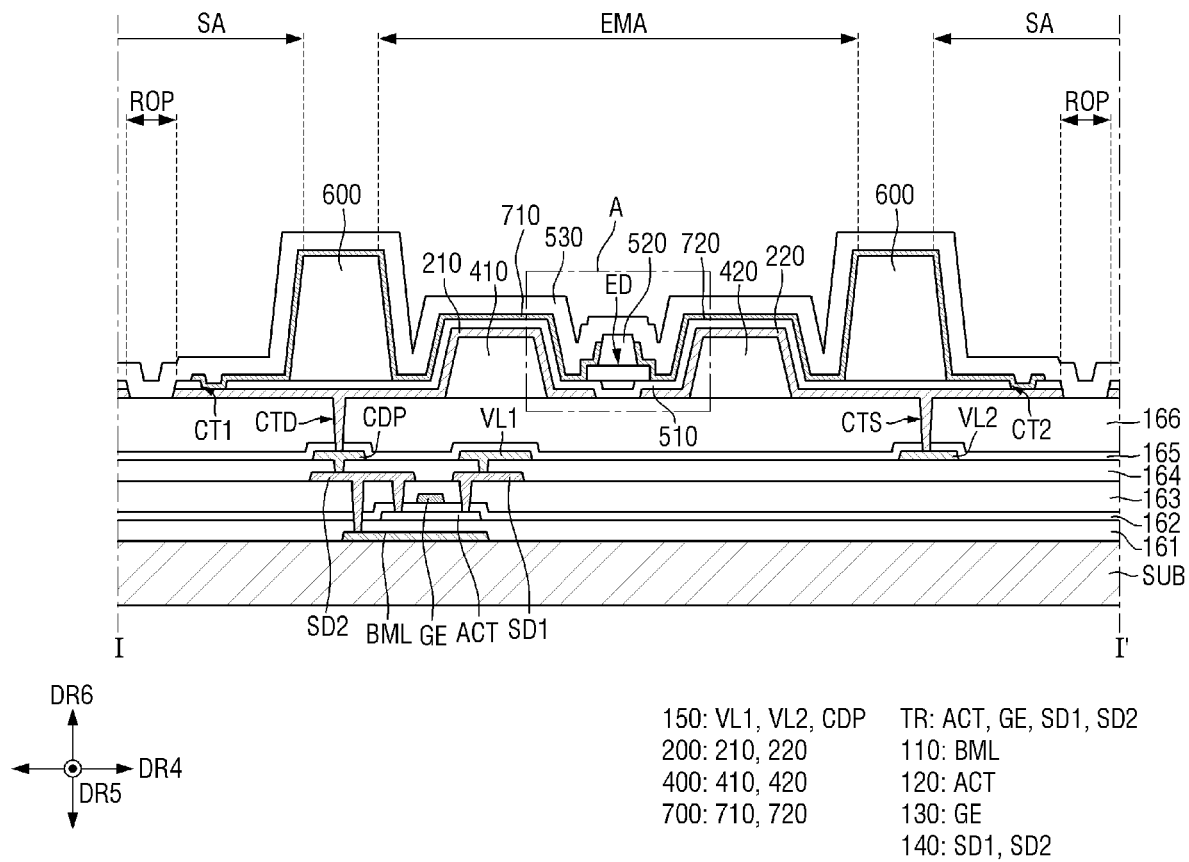
FIG. 17 is a schematic cross-sectional view showing an embodiment, taken along line I-I' of FIG. 16.

FIG. 16 is a layout view of a pixel of a display device according to an embodiment of the disclosure. FIG. 17 is a schematic cross-sectional view showing an embodiment, taken along line I-I' of FIG. 16.

Referring to FIG. 16, each pixel PX of the display device 10 may include an emission area EMA and a non-emission area. In the emission area EMA, light emitted from the light-emitting diodes ED may exit. In the non-emission area, light emitted from the light-emitting diodes ED may not reach and thus no light exits therefrom.

The emission area EMA may include an area where the light-emitting diodes ED are disposed, and an area adjacent to it. The emission area may further include an area in which light emitted from the light-emitting diodes ED is reflected or refracted by other elements to exit.

Each pixel PX may further include a subsidiary area SA disposed in the non-emission area. No light-emitting diodes ED may be disposed in the subsidiary area SA. The subsidiary area SA may be disposed on the upper side of the emission area EMA in a pixel PX in a plan view. The subsidiary area SA may be disposed between the emission areas EMA of neighboring pixels PX in the fifth direction DR5. The subsidiary area SA may include regions in which the electrode layer 200 and the contact electrodes 700 are electrically connected through contacts CT1 and CT2 to be described later. The subsidiary area SA may include a separation region ROP. In the separation region ROP of the subsidiary area SA, a first electrode 210 and a second electrode 220 included in the electrode layer 200 of a pixel PX may be separated from those of another pixel PX adjacent to the pixel PX in the fifth direction DR5, respectively.

Referring to FIGS. 16 and 17, the display device 10 may include a substrate SUB, a circuit element layer disposed on the substrate SUB, and an emission layer disposed on the circuit element layer.

The substrate SUB may be an insulating substrate. The substrate SUB may be made of an insulating material such as glass, quartz or polymer resin. The substrate SUB may be either a rigid substrate or a flexible substrate that can be bent, folded, or rolled.

The circuit element layer may be disposed on the substrate SUB. The circuit element layer may include a lower metal layer 110, a semiconductor layer 120, a first conductive layer 130, a second conductive layer 140, a third conductive layer 150 and multiple insulating layers.

The lower metal layer 110 may be disposed on the substrate SUB. The lower metal layer 110 may include a light-blocking pattern BML. The light-blocking pattern BML, may be disposed at least under a channel region of an active layer ACT of a transistor TR to cover it. It is, however, to be understood that the disclosure is not limited thereto. The light-blocking pattern BML may be omitted.

The lower metal layer 110 may include a material that blocks light. For example, the lower metal layer 110 may be made of an opaque metal material that blocks light transmission.

A buffer layer 161 may be disposed over the bottom metal layer 110. The buffer layer 161 may be disposed to cover the entire surface of the substrate SUB on which the bottom metal layer 110 is disposed. The buffer layer 161 may protect multiple transistors from moisture permeating through the substrate SUB which is vulnerable to moisture permeation.

The semiconductor layer 120 may be disposed on the buffer layer 161. The semiconductor layer 120 may include the active layer ACT of the transistor TR. The active layer ACT of the transistor TR may be disposed to overlap the light-blocking pattern BML of the lower metal layer 110 as described above.

The semiconductor layer 120 may include polycrystalline silicon, monocrystalline silicon, an oxide semiconductor, etc. According to an embodiment of the disclosure, in case that the semiconductor layer 120 includes polycrystalline silicon, the polycrystalline silicon may be formed by crystallizing amorphous silicon. In case that the semiconductor layer 120 includes polycrystalline silicon, the active layer ACT of the transistor TR may include multiple doped regions doped with impurities, and a channel region between them. In another embodiment, the semiconductor layer 120 may include an oxide semiconductor. For example, the oxide semiconductor may be indium-tin oxide (ITO), indium-zinc oxide (IZO), indium-gallium oxide (IGO), indium-zinc-tin oxide (IZTO), indium-gallium-zinc oxide (IGZO), indium-gallium-tin oxide (IGTO), indium-gallium-zinc-tin oxide (IGZTO), etc.

The gate insulator 162 may be disposed on the semiconductor layer 120. The gate insulator 162 may work as a gate insulating layer of a transistor. The gate insulator 162 may be made up of multiple layers in which inorganic layers including inorganic material, e.g., at least one of silicon oxide ($SiO_x$), silicon nitride ($SiN_x$) and silicon oxynitride ($SiO_xN_y$), are stacked each other alternately.

The first conductive layer 130 may be disposed on the gate insulator 162. The first conductive layer 130 may include the gate electrode GE of the transistor TR. The gate electrode GE may be disposed so that it overlaps the channel region of the active layer ACT in the thickness direction of the substrate SUB, i.e., in the sixth direction DR6.

A first interlayer dielectric layer 163 may be disposed on the first conductive layer 130. The first interlayer dielectric layer 163 may cover the gate electrode GE. The first interlayer dielectric layer 163 may serve as an insulating layer between the first conductive layer 130 and other layers disposed thereon and may protect the first conductive layer 130.

The second conductive layer 140 may be disposed on the first interlayer dielectric layer 163. The second conductive layer 140 may include a drain electrode SD1 of the transistor TR and a source electrode SD2 of the transistor TR.

The drain electrode SD1 and the source electrode SD2 of the transistor TR may be electrically connected to both end regions of the active layer ACT of the transistor TR through contact holes penetrating the first interlayer dielectric layer 163 and the gate insulator 162, respectively. The source electrode SD2 of the transistor TR may be electrically connected to the light-blocking pattern BML, of the lower metal layer 110 through another contact hole penetrating through the first interlayer dielectric layer 163, the gate insulator 162, and the buffer layer 161.

A second interlayer dielectric layer 164 may be disposed on the second conductive layer 140. The second interlayer dielectric layer 164 may be disposed to cover the drain electrode SD1 of the transistor TR and the source electrode SD2 of the transistor TR. The second interlayer dielectric layer 164 may serve as an insulating layer between the second conductive layer 140 and other layers disposed thereon and may protect the second conductive layer 140.

The third conductive layer 150 may be disposed on the second interlayer dielectric layer 164. The third conductive layer 150 may include a first voltage line VL1, a second voltage line VL2, and a conductive pattern CDP.

The first voltage line VL1 may overlap at least a part of the drain electrode SD1 of the transistor TR in the thickness direction of the substrate SUB. A high-level voltage (or first supply voltage) supplied to the transistor TR may be applied through the first voltage line VL1.

The second voltage line VL2 may be electrically connected to the second electrode 220 through a second electrode contact hole CTS penetrating through a via layer 166 and a passivation layer 165 to be described later. A low-level voltage (or second supply voltage), which is lower than the high-level voltage supplied to the first voltage line VL1, may be applied to the second voltage line VL2. Specifically, the high-level voltage (or first supply voltage) to be supplied to the transistor TR may be supplied to the first voltage line VL1, and the low-level voltage (or second supply voltage) which is lower than the high-level voltage supplied to the first voltage line VL1 may be supplied to the second voltage line VL2.

The conductive pattern CDP may be electrically connected to the source electrode SD2 of the transistor TR. The conductive pattern CDP may be electrically connected to the source electrode SD2 of the transistor TR through a contact hole penetrating the second interlayer dielectric layer 164. The conductive pattern CDP may be electrically connected to the first electrode 210 through a first electrode contact hole CTD penetrating the via layer 166 and the passivation layer 165 to be described later. The transistor TR may transmit the first supply voltage supplied from the first voltage line VL1 to the first electrode 210 through the conductive pattern CDP.

A passivation layer 165 may be disposed on the third conductive layer 150. The passivation layer 165 may be disposed to cover the third conductive layer 150. The passivation layer 165 may serve to protect the third conductive layer 150.

Each of the buffer layer 161, the first gate insulator 162, the first interlayer dielectric layer 163, the second interlayer dielectric layer 164, and the passivation layer 165 may be made up of multiple inorganic layers stacked each other alternately. For example, the buffer layer 161, the gate insulator 162, the first interlayer dielectric layer 163, the second interlayer dielectric layer 164, and the passivation layer 165 may be made up of a double layer in which inorganic layers including at least one of silicon oxide ($SiO_x$), silicon nitride ($SiN_x$), and silicon oxynitride (SiON) are stacked each other or may be made up of multiple layers in which the inorganic layers are alternately stacked each other. It is, however, to be understood that the disclosure is not limited thereto. The buffer layer 161, the gate insulator 162, the first interlayer dielectric layer 163, the second interlayer dielectric layer 164, and the passivation layer 165 may be made up of a single inorganic layer including the above-described insulating material.

The via layer 166 may be disposed on the passivation layer 165. The via layer 166 may include an organic insulating material, for example, an organic material such as polyimide (PI). The via layer 166 may provide a flat surface. Accordingly, the upper surface (or surface) of the via layer 166 on which the emission layer to be described later is disposed may have a generally flat surface regardless of whether there is a pattern thereunder or the shape of the pattern if any.

The emission layer may be disposed on the circuit element layer. The emission layer may be disposed on the via layer 166. The emission layer may include a first bank 400, electrode layers 200 including 210 and 220, a first insulating layer 510, a second bank 600, multiple light-emitting diodes ED, and contact electrodes 700 including 710 and 720.

The first bank 400 may be disposed on the via layer 166 in the emission area EMA. The first bank 400 may be disposed directly on a surface of the via layer 166. At least a part of the first bank 400 may protrude upward from the surface of the via layer 166 (e.g., in the sixth direction DR6). The protruding part of the first bank 400 may have inclined side surfaces. As the first bank 400 includes the inclined side surfaces, the light that is emitted from the light-emitting diodes ED and travels toward the side surfaces of the first bank 400 may be guided toward the upper side (e.g., display side).

The first bank 400 may include a first sub-bank 410 and a second sub-bank 420 spaced apart from each other. The first sub-bank 420 and the second sub-bank 420 spaced apart from each other may provide a space where the light-emitting diodes ED are disposed and may also work as reflective partition walls that may change the traveling direction of light emitted from the light-emitting diodes ED toward the display side.

Although the drawings show that the side surfaces of the first bank 400 have an inclined linear shape, the disclosure is not limited thereto. For example, the side surfaces (or outer surfaces) of the first bank 400 may have a rounded shape such as semi-circle or semi-ellipse. According to an embodiment of the disclosure, the first bank 400 may include, but is not limited to, an organic insulating material such as polyimide (PI).

The electrode layers 200 may have a shape extended in one direction and may be disposed to traverse the emission area EMA and the subsidiary area SA. The electrode layer 200 may transmit an electric signal applied from the circuit element layer to the light-emitting diodes ED to emit light. The electrode layer 200 may also be utilized to generate an electric field used in a process of aligning the multiple light-emitting diodes ED.

The electrode layer 200 may be disposed on the first bank 400 and the via layer 166 exposed by the first bank 400. The electrode layers 200 may be disposed on the first bank 400 in the emission area EMA, and may be disposed on the via layer 200 exposed by the first bank 400 in the non-emission area.

The electrode layer 200 may include a first electrode 210 and a second electrode 220. The first electrode 210 and the second electrode 220 may be spaced apart from each other.

The first electrode 210 may be disposed on one side of each pixel PX in the fourth direction DR4, e.g., on the left side in a plan view. The first electrode 210 may have a shape extended in the fifth direction DR5 in a plan view. The first electrode 210 may be disposed such that it passes through the emission area EMA and the subsidiary area SA. The first electrode 210 may be extended in the fifth direction DR5 in a plan view, and may be separated from the first electrode 210 of another pixel PX adjacent to it in the fifth direction DR5 at the separation region ROP of the subsidiary area SA.

The second electrode 220 may be spaced apart from the first electrode 210 in the fourth direction DR4. The second electrode 220 may be disposed on another side of each pixel PX in the fourth direction DR4, e.g., on the right side in a plan view. The second electrode 220 may have a shape extended in the fifth direction DR5 in a plan view. The second electrode 220 may be disposed such that it passes through the emission area EMA and the subsidiary area SA. The second electrode 220 may be extended in the fifth direction DR5 in a plan view, and may be separated from the second electrode 220 of another pixel PX adjacent to it in the fifth direction DR5 at the separation region ROP of the subsidiary area SA.

Specifically, in the emission area EMA, the first electrode 210 may be disposed on the first sub-bank 410, and the second electrode 220 may be disposed on the second sub-bank 420. The first electrode 210 may be extended outward from the first sub-bank 410 and may also be disposed on the via layer 166 exposed by the first sub-bank 410. Likewise, the second electrode 220 may be extended outward from the second sub-bank 420 and may also be disposed on the via layer 166 exposed by the second sub-bank 420. The first electrode 210 and the second electrode 220 may be spaced apart from each other between the first sub-bank 410 and the second sub-bank 420. The via layer 166 may be exposed between the first electrode 210 and the second electrode 220 spaced apart from each other.

The first electrode 210 may be spaced apart from the first electrode 210 of another pixel PX adjacent thereto in the fifth direction DR5 with the separation region ROP therebetween in the subsidiary area SA. Likewise, the second electrode 220 may be spaced apart from the second electrode 220 of another pixel PX adjacent thereto in the fifth direction DR5 with the separation region ROP therebetween in the subsidiary area SA. Accordingly, the first electrode 210 and the second electrode 220 may expose the via layer 166 at the separation region ROP of the subsidiary area SA.

The first electrode 210 may be electrically connected to the conductive pattern CDP of the circuit element layer through the first electrode contact hole CTD penetrating the via layer 166 and the passivation layer 165. Specifically, the first electrode 210 may be in contact with the upper surface of the conductive pattern CDP exposed by the first electrode contact hole CTD. The first supply voltage supplied from the first voltage line VL1 may be transmitted to the first electrode 210 through the conductive pattern CDP.

The second electrode 220 may be electrically connected to the second voltage line VL2 of the circuit element layer through the second electrode contact hole CTS penetrating the via layer 166 and the passivation layer 165. Specifically, the second electrode 220 may be in contact with the upper surface of the second voltage line VL2 exposed by the second electrode contact hole CTS. The second supply voltage supplied from the second voltage line VL2 may be delivered to the second electrode 220.

The electrode layer 200 may include a conductive material having high reflectance. For example, the electrode layer 200 may include metal such as silver (Ag), copper (Cu) and aluminum (Al) as the material having high reflectance, and may include alloy including aluminum (Al), nickel (Ni), lanthanum (La), etc. The electrode layer 200 may reflect light that is emitted from the light-emitting diodes ED and travels toward the side surfaces of the first bank 400 toward the upper side of each of the pixels PX.

It is, however, to be understood that the disclosure is not limited thereto. The electrode layer 200 may further include a transparent conductive material. For example, the electrode layer 200 may include a material such as ITO, IZO and ITZO. In some embodiments, the electrode layer 200 may have a structure in which one or more layers of a transparent conductive material and a metal layer having high reflectance are stacked each other, or may be made up of a single layer including them. For example, the electrode layer 200 may have a stack structure such as ITO/Ag/ITO/, ITO/Ag/IZO, or ITO/Ag/ITZO/IZO.

The first insulating layer 510 may be disposed on the via layer 166 on which the electrode layers 200 are formed. The first insulating layer 510 may protect the electrode layers 200, and may insulate the first electrode 210 and the second electrode 220 from each other.

The first insulating layer 510 may include an inorganic insulating material. For example, the first insulating layer 510 may include at least one inorganic insulating material such as silicon oxide ($SiO_x$), silicon nitride ($SiN_x$), silicon oxynitride ($SiO_xN_y$), aluminum oxide ($Al_xO_y$) and aluminum nitride (AlN). The first insulating layer 510 made of an inorganic material may have a surface shape conforming to the pattern shape of the electrode layers 200 thereunder. For example, the first insulating layer 510 may have a stair-like shape according to the shape of the electrode layers 200 disposed under the first insulating layer 510. Specifically, a part of the upper surface of the first insulating layer 510 may be depressed between the first electrode 210 and the second electrode 220 spaced apart from each other. Accordingly, the height of the upper surface of the first insulating layer 510 disposed on the first electrode 210 and the second electrode 220 may be longer than the height of the upper surface of the first insulating layer 510 disposed on the via layer 166 where the first electrode 210 and the second electrode 220 are not disposed. Herein, heights of different portions of a layer may be compared with each other based on the heights measured from a flat reference surface where no structure is disposed thereunder (e.g., from the upper surface of the via layer 166).

The first insulating layer 510 may include a first contact CT1 exposing a part of the upper surface of the first electrode 210, and a second contact CT2 exposing a part of the upper surface of the second electrode 220 in the subsidiary area SA. The first electrode 210 may be electrically connected to a first contact electrode 710 through the first contact CT1 penetrating the first insulating layer 510 in the subsidiary area SA, and the second electrode 220 may be electrically connected to a second contact electrode 720 through the second contact CT2 penetrating the first insulating layer 510 in the subsidiary area SA.

The second bank 600 may be disposed on the first insulating layer 510. The second bank 600 may be disposed in a lattice pattern, including portions extended in the fourth direction DR4 and the fifth direction DR5 in a plan view.

The second bank 600 may be disposed on the boundary of the pixels SPX to separate neighboring pixels PX, and may separate the emission area EMA from the subsidiary area SA. The second bank 600 may have a height greater than that of the first bank 400. Accordingly, during an inkjet printing process for aligning the light-emitting diodes ED of the process of fabricating the display device 10, it is possible to prevent that the ink in which the multiple light-emitting diodes ED is dispersed is mixed into the adjacent pixel PX, and thus the ink may be ejected into the emission area EMA.

The multiple light-emitting diodes ED may be disposed in the emission area EMA. The multiple light-emitting diodes ED may not be disposed in the subsidiary area SA.

The light-emitting diodes ED may be disposed on the first insulating layer 510 between the first sub-bank 410 and the second sub-bank 420. The light-emitting diodes ED may be disposed on the first insulating layer 510 between the first electrode 210 and the second electrode 220.

The light-emitting diodes ED may have a shape extended in a direction, and may be disposed so that each of their ends are placed on the first electrode 210 and the second electrode 220, respectively. For example, the multiple light-emitting diodes ED may be disposed such that the first ends of the light-emitting diodes ED are placed on the first electrode 210 while the second ends of the light-emitting diodes ED are placed on the second electrode 220.

The length of each of the light-emitting diodes ED in the longitudinal direction (i.e., the fourth direction DR4 in the drawings) may be smaller than the shortest distance between the first sub-bank 410 and the second sub-bank 420 spaced apart from each other in the fourth direction DR4. The length of each of the light-emitting diodes in the longitudinal direction ED may be greater than the shortest distance between the first electrode 210 and the second electrode 220 spaced apart from each other in the fourth direction DR4. The distance between the first sub-bank 410 and the second sub-bank 420 in the fourth direction DR4 may be greater than the length of each of the light-emitting diodes ED, and the distance between the first electrode 210 and the second electrode 220 in the fourth direction DR4 may be smaller than the length of each of the light-emitting diodes ED, so that the multiple light-emitting diodes ED may be disposed such that their each ends are placed on the first electrode 210 and the second electrode 220 between the first sub-bank 410 and the second sub-bank 420, respectively.

The light-emitting diodes ED may be spaced apart from one another along the fifth direction DR5 in which the first and second electrodes 210 and 220 are extended, and may be aligned substantially parallel to one another.

The second insulating layer 520 may be disposed on the light-emitting diodes ED. The second insulating layer 520 may be disposed on the light-emitting diodes ED to expose the both ends of the light-emitting diodes ED. The second insulating layer 520 may be disposed to partially surround the outer surfaces of the light-emitting diodes ED so that the first ends and the second ends of the light-emitting diodes ED are not covered.

The second insulating layer 520 which is disposed on the light-emitting diodes ED may be extended in the fifth direction DR5 on the first insulating layer 510 in a plan view, thereby forming a linear or island-like pattern in each pixel PX. The second insulating layer 520 may protect the light-emitting diodes ED and fix the light-emitting diodes ED during the process of fabricating the display device 10. The second insulating layer 520 may be disposed to fill the space between light-emitting diodes ED and the first insulating layer 510 thereunder.

The contact electrodes 700 may be disposed on the second insulating layer 520. The contact electrodes 700 may be disposed on the first insulating layer 510 where the light-emitting diodes ED are disposed. The contact electrodes 700 may include a first contact electrode 710 and a second contact electrode 720 spaced apart from each other.

The first contact electrode 710 may be disposed on the first electrode 210 in the emission area EMA. The first contact electrode 710 may have a shape extended in the fifth direction DR5 on the first electrode 210. The first contact electrode 710 may be in contact with the first electrode 210 and the first ends of the light-emitting diodes ED.

The first contact electrode 710 may be in contact with the first electrode 210 exposed by the first contact CT1 penetrating through the first insulating layer 510 in the subsidiary area SA, and may be in contact with the first ends of the light-emitting diodes ED in the emission area EMA. For example, the first contact electrode 710 may electrically connect the first electrode 210 with the first ends of the light-emitting diodes ED.

The second contact electrode 720 may be disposed on the second electrode 220 in the emission area EMA. The second contact electrode 720 may have a shape extended in the fifth direction DR5 on the second electrode 220. The second contact electrode 720 may be in contact with the second electrode 220 and the second ends of the light-emitting diodes ED.

The second contact electrode 720 may be in contact with the second electrode 220 exposed by the second contact CT2 penetrating through the first insulating layer 510 in the subsidiary area SA, and may be in contact with the second ends of the light-emitting diodes ED in the emission area EMA. For example, the second contact electrode 720 may electrically connect the second electrode 220 with the second ends of the light-emitting diodes ED.

The first contact electrode 710 and the second contact electrode 720 may be spaced apart from each other on the light-emitting diodes ED. Specifically, the first contact electrode 710 and the second contact electrode 720 may be spaced apart from each other with the second insulating layer 520 therebetween. The first contact electrode 710 and the second contact electrode 720 may be electrically insulated from each other.

The first contact electrode 710 and the second contact electrode 720 may include the same material. For example, each of the first contact electrode 710 and the second contact electrode 720 may include a conductive material. For example, the first contact electrode 710 and the second contact electrode 720 may include ITO, IZO, ITZO, aluminum (Al), etc. For example, each of the first contact electrode 710 and the second contact electrode 720 may include a transparent conductive material. Since the first contact electrode 710 and the second contact electrode 720 each include a transparent conductive material, the light emitted from the light-emitting diodes ED may pass through the first contact electrode 710 and the second contact electrode 720 to proceed toward the first electrode 210 and the second electrode 220, and may be reflected from the surfaces of the first electrode 210 and the second electrode 220. The first contact electrode 710 and the second contact electrode 720 may include the same material and may be disposed on the same layer. The first contact electrode 710 and the second contact electrode 720 may be formed together through the same process.

The third insulating layer 530 may be disposed on the contact electrodes 700. The third insulating layer 530 may cover the emission layer disposed thereunder. The third insulating layer 530 may cover the first bank 400, the electrode layers 200, the first insulating layer 510, the multiple light-emitting diodes ED, and the contact electrodes 700. The third insulating layer 530 may be disposed on the second bank 600 to cover the second bank 600 as well.

The third insulating layer 530 may protect the emission layer disposed thereunder from foreign substances such as moisture/oxygen or dust particles. The third insulating layer 530 may protect the first bank 400, the electrode layers 200, the first insulating layer 510, the multiple light-emitting diodes ED, and the contact electrodes 700.

Figure 18:
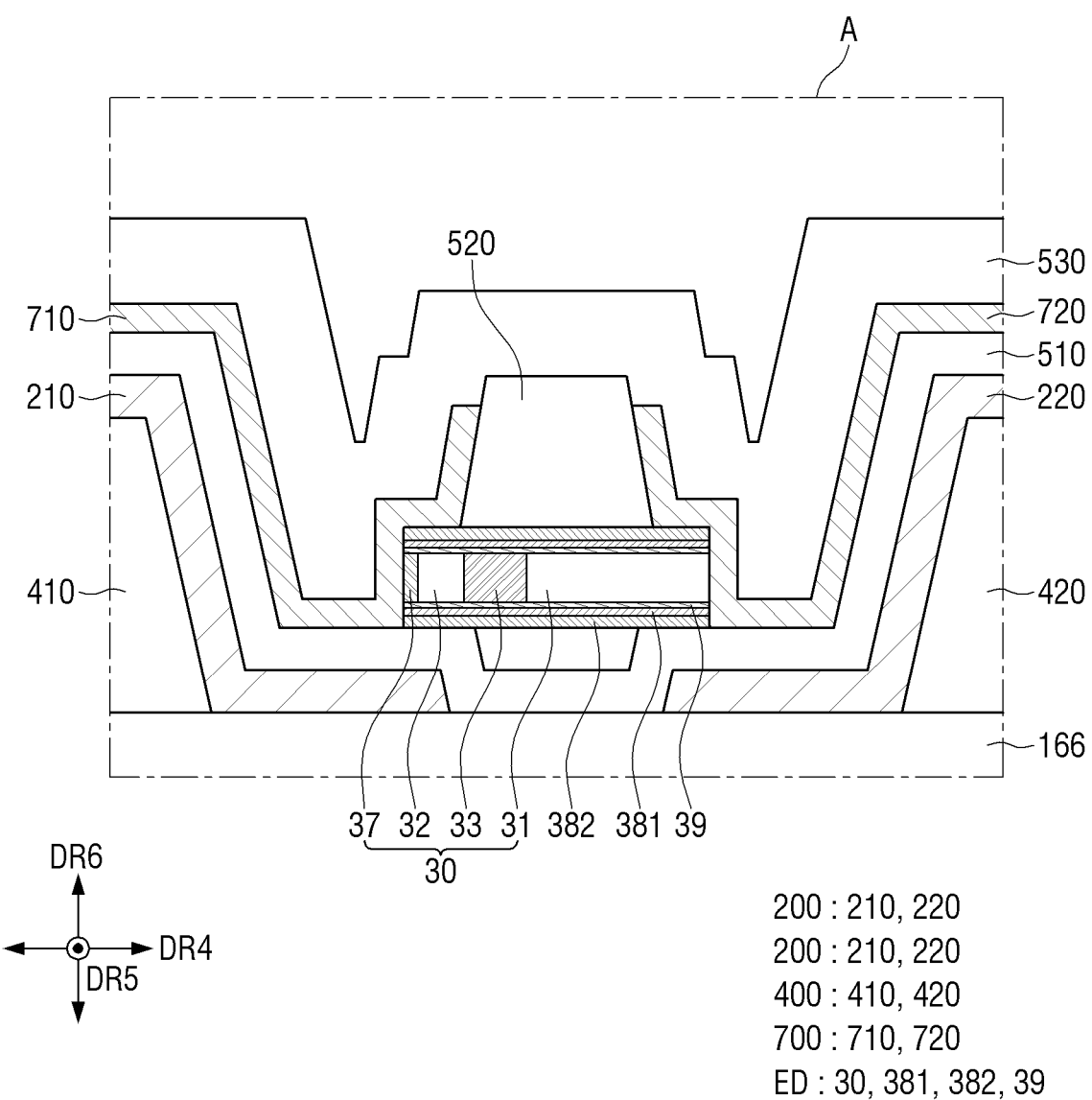
FIG. 18 is an enlarged schematic cross-sectional view showing an embodiment of area A of FIG. 17.

FIG. 18 is an enlarged schematic cross-sectional view showing an embodiment of area A of FIG. 17.

Referring to FIG. 18, the light-emitting diode ED may be disposed such that the direction in which it is extended is parallel to a surface of the substrate SUB. The multiple semiconductor layers included in the light-emitting diode ED may be arranged sequentially in the direction parallel to the upper surface of the substrate SUB (or the upper surface of the via layer 166). For example, the first semiconductor layer 31, the emissive layer 33, and the second semiconductor layer 32 of the light-emitting diode ED may be arranged sequentially parallel to the upper surface of the substrate SUB.

Specifically, the first semiconductor layer 31, the emissive layer 33, the second semiconductor layer 32, and the element electrode layer 37 of the light-emitting diode ED may be sequentially formed parallel to the upper surface of the substrate SUB in the cross section traversing the both ends of the light-emitting diode ED. As used herein, the direction parallel to the upper surface of the substrate SUB may refer to the fourth direction DR4 or the fifth direction DR5, and multiple semiconductor layers may be sequentially disposed in the fourth direction DR4 in the light-emitting diode ED as in the drawings.

A first end of the light-emitting diode ED may be located on the first electrode 210, while a second end thereof may be located on the second electrode 220. It should be understood that the disclosure is not limited thereto. The first end of the light-emitting diode ED may be located on the second electrode 220, while the second end thereof may be located on the first electrode 210.

The second insulating layer 520 may be disposed on the light-emitting diodes ED. The second insulating layer 520 may be disposed to surround the outer surface of the light-emitting diode ED. The second insulating layer 520 may be disposed on the second element insulating film 382 of the light-emitting diode ED, and may surround the outer surface of the second element insulating film 382 of the light-emitting diode ED facing in the display direction DR6.

The second insulating layer 520 may be disposed to surround the outer surface of the light-emitting diode ED (specifically, the second element insulating film 382 of the light-emitting diode ED) where the light-emitting diode ED is disposed, and the second insulating layer 520 may be disposed on the first insulating layer 510 exposed by the light-emitting diode ED where the light-emitting diode ED is not disposed.

The first contact electrode 710 may be in contact with a first end of the light-emitting diode ED exposed by the second insulating layer 520. Specifically, the first contact electrode 710 may be disposed to surround an end surface of the light-emitting diode ED exposed by the second insulating layer 520. The first contact electrode 710 may be in contact with the insulating films 39, 381 and 382 surrounding the light-emitting diode ED and the element electrode layer 37.

The second contact electrode 720 may be in contact with a second end of the light-emitting diode ED exposed by the second insulating layer 520. Specifically, the second contact electrode 720 may be disposed to surround the other end surface of the light-emitting diode ED exposed by the second insulating layer 520. The second contact electrode 720 may be in contact with the insulating films 39, 381 and 382 and the first semiconductor layer 31 of the light-emitting diode ED.

The first contact electrode 710 and the second contact electrode 720 may be spaced apart from each other with the second insulating layer 520 therebetween. The first contact electrode 710 and the second contact electrode 720 may expose at least a part of the upper surface of the second insulating layer 520.

The first contact electrode 710 and the second contact electrode 720 may be disposed on the same layer and may include the same material. For example, the first contact electrode 710 and the second contact electrode 720 may be formed together through a single mask process. Therefore, no additional mask process is required to form the first and second contact electrodes 710 and 720, and thus the efficiency of the process of fabricating the display device 10 may be improved.

Figure 19:
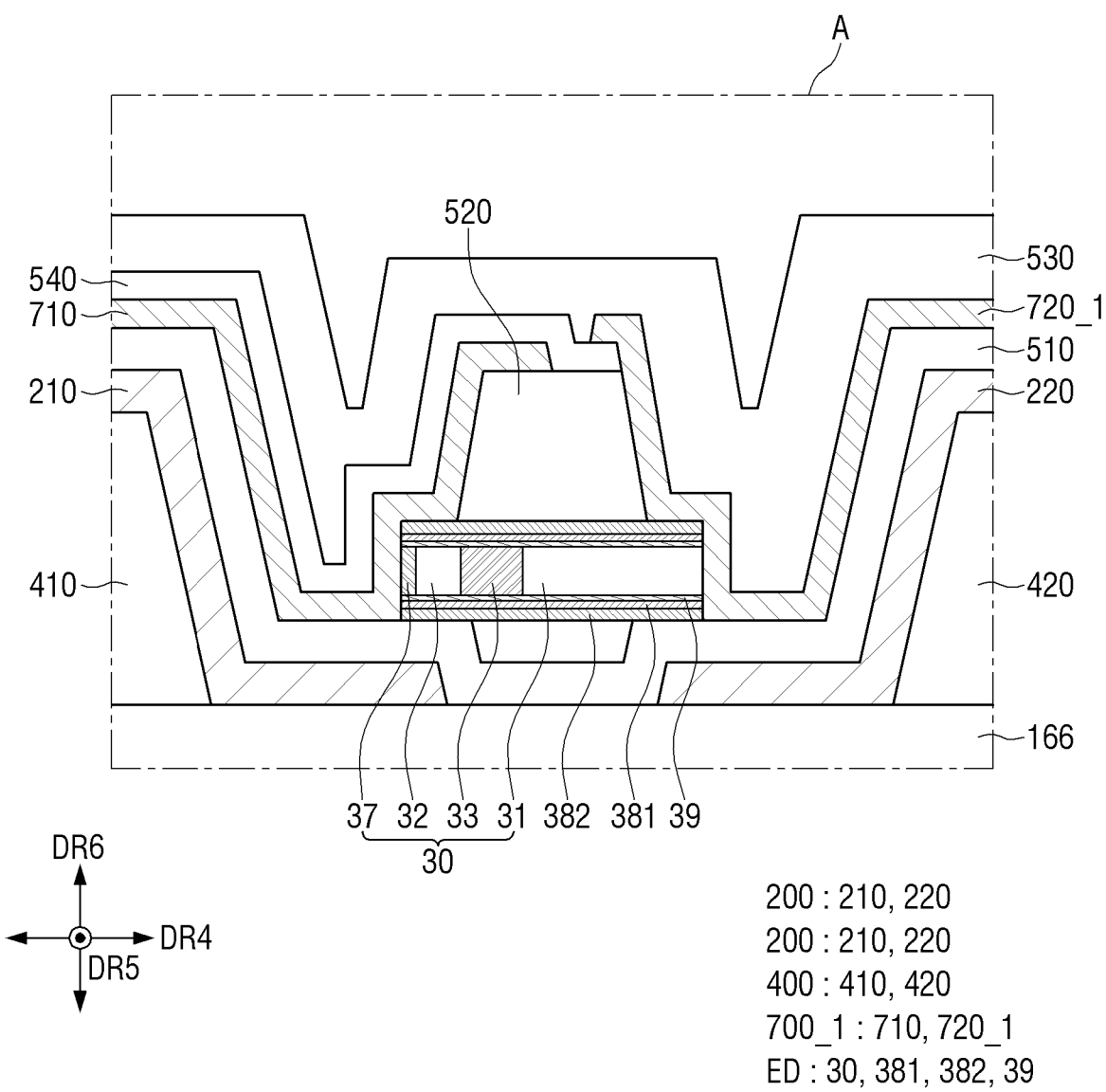
FIG. 19 is an enlarged schematic cross-sectional view showing another embodiment of area A of FIG. 17.

FIG. 19 is an enlarged schematic cross-sectional view showing another embodiment of area A of FIG. 17.

The embodiment of FIG. 19 is different from the embodiment of FIG. 18 in that a contact electrode 700_1 includes a first contact electrode 710 and a second contact electrode 720_1 disposed on different layers, and that a display device 10 further includes a fourth insulating layer 540.

Specifically, the contact electrodes 700_1 may include the first contact electrode 710 and the second contact electrode 720_1 disposed on different layers.

The first contact electrode 710 may be disposed on the first electrode 210 and the first end of the light-emitting diode ED. The first contact electrode 710 may be extended from the first end of the light-emitting diode ED toward the second insulating layer 520 and may be disposed on one sidewall of the second insulating layer 520 and the upper surface of the second insulating layer 520 as well. The first contact electrode 710 may be disposed on the upper surface of the second insulating layer 520, and may expose at least a part of the upper surface of the second insulating layer 520.

The fourth insulating layer 540 may be disposed on the first contact electrode 710. The fourth insulating layer 540 may be disposed to completely cover the first contact electrode 710. The fourth insulating layer 540 may be disposed to completely cover one sidewall and the upper surface of the second insulating layer 520, but may not be disposed on the other sidewall of the second insulating layer 520. One end of the fourth insulating layer 540 may be aligned with the other sidewall of the second insulating layer 520.

The second contact electrode 720_1 may be disposed on the second electrode 220 and on the second end of the light-emitting diode ED. The second contact electrode 720_1 may be extended from the second end of the light-emitting diode ED toward the second insulating layer 520 and may be disposed on the other sidewall of the second insulating layer 520 and the upper surface of the fourth insulating layer 540 as well.

The third insulating layer 530 may be disposed on the fourth insulating layer 540 and the second contact electrode 720_1. The third insulating layer 530 may be disposed on the fourth insulating layer 540 and the second contact electrode 720_1 to cover them.

According to this embodiment, even though the efficiency of the process of fabricating the display device 10 may be lower because an additional process is added as the first contact electrode 710 and the second contact electrode 720_1 are disposed different layers and the fourth insulating layer 540 is interposed therebetween, the reliability of the display device 10 may be improved. Specifically, as the first contact electrode 710 and the second contact electrode 720_1 are disposed on different layers and the fourth insulating layer 540 is interposed therebetween, it is possible to prevent the issue of a short-circuit between the first contact electrode 710 and the second contact electrode 720_1 during the process of fabricating the display device 10.

Figure 20:
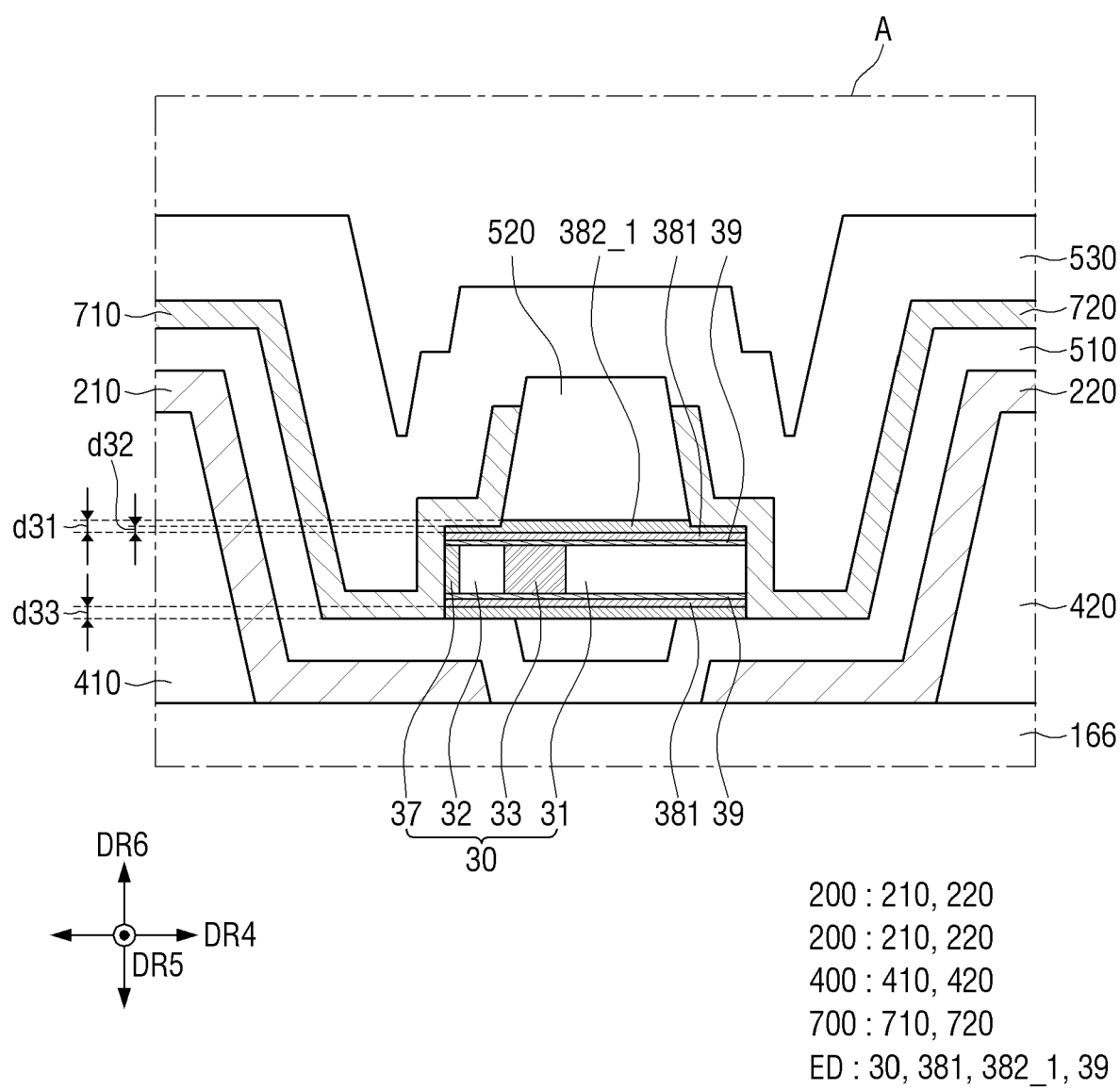
FIG. 20 is an enlarged schematic cross-sectional view showing another embodiment of area A of FIG. 17.

FIG. 20 is an enlarged schematic cross-sectional view showing another embodiment of area A of FIG. 17

The embodiment of FIG. 20 is different from the embodiment of FIG. 18 in that a second element insulating layer 382_1 of a light-emitting diode ED facing the display side of a display device 10 has different thicknesses.

Specifically, the second element insulating layer 382_1 of the light-emitting diode ED aligned between the first electrode 210 and the second electrode 220 may have different thicknesses for different portions. The second element insulating film 382_1 positioned above the core 30 in the cross-sectional view traversing the light-emitting diode ED may have a first thickness d31 where it overlaps the second insulating layer 520 and a second thickness d32 smaller than the first thickness d31 where it does not overlap the second insulating layer 520. The second element insulating film 382_1 positioned below the core 30 in the cross-sectional view traversing the light-emitting diode ED may have a third thickness d33 equal to the first thickness d31. A part of the second element insulating film 382_1 positioned above the core 30 may face the display side, while another part of the second element insulating film 382_1 positioned below the core 30 may face the first insulating layer 510.

For example, the second element insulating film 382_1 overlapping the second insulating layer 520 and positioned above the core 30 and the second element insulating film 382_1 positioned below the core 30 may have the same thickness, while the second element insulating film 382_1 that does not overlap the second insulating layer 520 and is positioned above the core 30 may be thinner than the second element insulating layer 382_1 overlapping the second insulating layer 520 and positioned above the core 30. This may be formed by etching a part of the second element insulating film 382_1 during the process of fabricating the display device 10.

Specifically, the second element insulating film 382_1 may form the outer surface of the light-emitting diode ED aligned on the via layer 166, so that the second element insulating film 382_1 may protect the core 30 and the first element insulating film 381 from an etchant used in an etching process for forming multiple elements formed after an alignment process of the light-emitting diodes ED in the processes of fabricating the display device 10. The part of the second element insulating film 382_1 that does not overlap the second insulating layer 520 and is exposed toward the display side may be etched out. Accordingly, the second element insulating film 382_1 may have different thicknesses.

In order to stably protect the first element insulating film 381, the interlayer dielectric film 39 and the core 30 even though the second element insulating film 382_1 is partially etched out and removed during the process of fabricating the display device 10, the second element insulating film 382_1 may have a slower etch rate than the first element insulating film 381 and may have a thickness above a certain level. Accordingly, as described above, in the embodiment, the second element insulating film 382_1 may include aluminum oxide ($Al_2O_3$), which has a slow etching rate with respect to the etchant. The thickness of the second element insulating film 382_1 may be greater than the thickness of the first element insulating film 381 and the thickness of the interlayer dielectric film 39.

In concluding the detailed description, those skilled in the art will appreciate that many variations and modifications can be made to the embodiments without substantially departing from the principles of the disclosure. Therefore, the disclosed embodiments of the disclosure are used in a generic and descriptive sense only and not for purposes of limitation.

What is claimed is:

1. A light-emitting element comprising:
   a core comprising:
      a first semiconductor layer;
      a second semiconductor layer disposed on the first semiconductor layer; and
      an emissive layer disposed between the first semiconductor layer and the second semiconductor layer;
   an interlayer dielectric film surrounding a side surface of the core;
   a first element insulating film surrounding an outer surface of the interlayer dielectric film; and
   a second element insulating film surrounding an outer surface of the first element insulating film, wherein
   the interlayer dielectric film comprises an oxide insulating material having a dielectric constant of about 10 or more, and
   the interlayer dielectric film has a thickness of less than 5 nm.

2. The light-emitting element of claim 1, wherein
   the thickness of the interlayer dielectric film is smaller than a thickness of the first element insulating film, and
   the thickness of the interlayer dielectric film is smaller than a thickness of the second element insulating film.

3. The light-emitting element of claim 1, wherein the interlayer dielectric film has a thickness of about 2 nm or less.

4. The light-emitting element of claim 1, wherein a thickness of the first element insulating film is smaller than a thickness of the second element insulating film.

5. The light-emitting element of claim 4, wherein a ratio of the thickness of the first element insulating film to the thickness of the second element insulating film is about 1:4.

6. The light-emitting element of claim 1, wherein the side surface of the core comprises at least one of a side surface of the first semiconductor layer, a side surface of the second semiconductor layer, and a side surface of the emissive layer.

7. The light-emitting element of claim 1, wherein a dielectric constant of the interlayer dielectric film is greater than a dielectric constant of the first element insulating film.

8. The light-emitting element of claim 1, wherein an etch rate of the first element insulating film with respect to an etchant is lower than an etch rate of the second element insulating film.

9. The light-emitting element of claim 1, wherein the interlayer dielectric film comprises at least one of hafnium silicon oxide ($HfSiO_x$), scandium oxide ($Sc_xO_y$), hafnium oxide ($HfO_x$), zirconium oxide ($ZrO_x$), strontium oxide (SrO), yttrium oxide ($Y_xO_y$), tantalum oxide ($Ta_xO_y$), barium oxide (BaO), tungsten oxide $WO_x$, titanium oxide ($TiO_x$), and lanthanum oxide ($La_xO_y$).

10. The light-emitting element of claim 1, wherein the first element insulating film comprises silicon oxide ($SiO_x$).

11. The light-emitting element of claim 1, wherein the second element insulating film comprises aluminum oxide ($Al_xO_y$).

12. The light-emitting element of claim 1, wherein the core, the interlayer dielectric film, the first element insulating film, and the second element insulating film have a circular shape in a plan view.

13. The light-emitting element of claim 1, wherein a length of the core in a longitudinal direction is greater than a length of the interlayer dielectric film in the longitudinal direction.

14. The light-emitting element of claim 1, wherein a thin-film density of the first element insulating film is higher than a thin-film density of the second element insulating film.

15. A display device comprising:
a first electrode and a second electrode disposed on a substrate and spaced apart from each other;
a light-emitting element disposed between the first electrode and the second electrode; and
an insulating layer disposed on the light-emitting element, wherein
the light-emitting element comprises:
a core comprising:
a first semiconductor layer;
a second semiconductor layer disposed on the first semiconductor layer; and
an emissive layer disposed between the first semiconductor layer and the second semiconductor layer;
an interlayer dielectric film surrounding a side surface of the core;
a first element insulating film surrounding an outer surface of the interlayer dielectric film; and
a second element insulating film surrounding an outer surface of the first element insulating film,
the insulating layer at least partially overlaps the interlayer dielectric film, the first element insulating film, and the second element insulating film in a thickness direction of the substrate,
the first semiconductor layer, the emissive layer, and the second semiconductor layer are sequentially arranged in a direction intersecting the thickness direction of the substrate,
the interlayer dielectric film comprises an oxide insulating material having a dielectric constant of about 10 or more, and
the interlayer dielectric film has a thickness of less than 5 nm.

16. The display device of claim 15, wherein
a thickness of the interlayer dielectric film is smaller than a thickness of the first element insulating film,
the thickness of the interlayer dielectric film is smaller than a thickness of the second element insulating film, and
the thickness of the first element insulating film is smaller than the thickness of the second element insulating film.

17. The display device of claim 15, wherein the interlayer dielectric film comprises an oxide insulating material having a dielectric constant of about 10 or more.

18. The display device of claim 15, wherein the interlayer dielectric film has a thickness of less than or equal to about 5 nm.

19. The display device of claim 15, wherein
the first electrode and the second electrode are spaced apart from each other in the direction intersecting the thickness direction of the substrate, and
a length of the light-emitting element in the direction intersecting the thickness direction of the substrate is greater than a shortest distance between the first electrode and the second electrode.

20. The display device of claim 15, wherein
the second element insulating film comprises:
a first portion overlapping the insulating layer in the thickness direction of the substrate and having a first thickness, and
a second portion offset from the insulating layer in the thickness direction of the substrate and having a second thickness, and
the first thickness is greater than the second thickness.

* * * * *